(12) United States Patent
Shirai et al.

(10) Patent No.: US 6,239,956 B1
(45) Date of Patent: *May 29, 2001

(54) FAIL-SAFE TIMING CIRCUIT AND ON-DELAY CIRCUIT USING THE SAME

(75) Inventors: Toshihito Shirai; Koichi Futsuhara, both of Urawa (JP)

(73) Assignee: The Nippon Signal Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 08/913,143

(22) PCT Filed: Dec. 5, 1996

(86) PCT No.: PCT/JP96/03569

§ 371 Date: Aug. 13, 1997

§ 102(e) Date: Aug. 13, 1997

(87) PCT Pub. No.: WO97/21271

PCT Pub. Date: Jun. 12, 1997

(30) Foreign Application Priority Data

Dec. 5, 1995 (JP) ................................................ 7-316934

(51) Int. Cl.[7] ...................................................... H02H 7/00
(52) U.S. Cl. ............................... 361/18; 361/78; 361/111; 361/115
(58) Field of Search ............................. 301/18, 196, 115, 301/78, 119, 111

(56) References Cited

U.S. PATENT DOCUMENTS

| | | | | |
|---|---|---|---|---|
| 4,661,880 | * | 4/1987 | Futsuhara | 361/93 |
| 5,027,114 | * | 6/1991 | Kawashima et al. | 340/941 |
| 5,867,775 | * | 2/1999 | Shirai et al. | 455/115 |

FOREIGN PATENT DOCUMENTS

| | | | | |
|---|---|---|---|---|
| 0 644 655 | * | 3/1995 | (EP) | H03K/5/13 |
| 62-104310 | * | 5/1987 | (JP) | H03K/17/292 |
| 1-23006 | * | 4/1989 | (JP) | H03K/5/04 |
| 2-141122 | * | 5/1990 | (JP) | H03K/5/13 |

OTHER PUBLICATIONS

Koichi Futsuhara and Masao Mukaidono "Realization of a Fail–Safe Train Wheel Sensor Using Electromagnetic Induction" Apr., 1989 IEEE.*

Koichi Futsuhara and Masao Mukaidono "Application of Window Comparator to Majority Operation" 1989 IEEE.*

Koichi Futsuhara and Masao Mukaidono "A Construction Method for an Interlock System Using a Fail–Safe Logic Element Having Window Characteristics" Sep. 1989 IEEE Japan.*

(List continued on next page.)

Primary Examiner—Stephen W. Jackson
(74) Attorney, Agent, or Firm—Wolf, Greenfield & Sacks, P.C.; James H. Morris

(57) ABSTRACT

The present invention relates to a fail-safe timing circuit and on-delay circuit which does not produce an erroneous output where the delay time is shortened, due to a fault. The timing circuit comprises: an oscillation circuit (11) which produces a timing output from a cathode terminal of a PUT after a predetermined time lapse from input of an input signal ($V_{IN}$); and a monitoring circuit (12) for monitoring for the normalcy of the oscillation circuit (11). Moreover the on-delay circuit comprises a self hold circuit (13) with an output signal (Vo) generated from the monitoring circuit (12) only when the normalcy of the oscillation circuit (11) is verified by generation of a falling signal of a cathode terminal voltage of the oscillation circuit (11), input to a second terminal (b), and the input signal ($V_{IN}$) input to a first terminal (a), which produces an output signal only when the two input signals are both at a higher level than a power source potential.

13 Claims, 16 Drawing Sheets

OTHER PUBLICATIONS

Masakazu Kato, et al "LSI Implementation and Safety Verification of Window Comparator Used in Fail–Safe Multiple–Valued Logic Operations" IEICE Trans. Electron Mar., 1993.*

European Search Report from European Patent Application 96941183 Apr. 29, 199.*

Patent Abstracts of Japan, vol. 095, No. 004, May 31, 1995 & JP–A–07 022932 (Nippon Signal Co. Ltd.).*

* cited by examiner (A)

(B)

US 6,239,956 B1

FAIL-SAFE TIMING CIRCUIT AND ON-DELAY CIRCUIT USING THE SAME

TECHNICAL FIELD

The present invention relates to a fail-safe timing circuit in which a timing interval is not shortened at the time of a fault, and to a fail-safe on-delay circuit which utilizes such a timing circuit so that the delay time is not shortened at the time of a fault.

BACKGROUND ART

With a fail-safe on-delay circuit, an error wherein the delay time is shortened due to a fault is not permitted. Heretofore, with on-delay circuits it has been common to use a counter circuit as a timing circuit for setting the delay time. With a counter circuit however there are problems for example in that the frequency of the clock signal used for timing can increase with a malfunction so that the delay time is shortened, or that if the circuit faults, an output signal can be generated although an input signal is not being applied.

In order to solve such problems, there has been proposed (Japanese Unexamined Patent Publication No. 2-141122) a fail-safe on-delay circuit which uses in the timing circuit, a PUT oscillation circuit which uses a programmable uni-junction transistor (referred to hereunder as PUT). The construction of the fail-safe on-delay circuit is such that a delay output is generated on receipt of an output signal from the PUT oscillation circuit.

FIG. 15 shows such a conventional basic on-delay circuit which uses a PUT oscillation circuit.

In FIG. 15, the on-delay circuit comprises a PUT oscillation circuit 1, and a self hold circuit 2 which produces an output on receipt of an output signal of a predetermined level from the PUT oscillation circuit 1, and self holds the output. The PUT oscillation circuit 1 comprises; resistors $R_1 \sim R_4$, a capacitor $C_1$, and a PUT. The self hold circuit 2 comprises a logical product circuit 3 having two signal input terminals a, b, and a rectifying circuit 4 and a feed back resistor Rf for feeding back an output from the logical product circuit 3 to the second terminal b so that the output is self held.

The operation of the on-delay circuit will now be described with reference to the operation time chart shown in FIG. 16.

When an input signal $V_{IN}$ is input to the PUT oscillation circuit 1, then at first, the PUT oscillation circuit 1 becomes condition A. In condition A, the PUT is off so that the capacitor $C_1$ of the PUT oscillation circuit 1 is gradually charged and the anode terminal voltage $V_A$ rises. Once the capacitor $C_1$ has been charged to a predetermined voltage level (a gate terminal voltage $V_G$) the PUT comes on, giving condition B. In condition B, the anode terminal and the cathode terminal, and the gate terminal and the cathode terminal of the PUT are short circuited. Hence the charge stored in the capacitor $C_1$ is discharged via the PUT, the anode terminal voltage $V_A$ drops, and an anode current $i_A$ and a gate current $i_G$ flow, producing a cathode current $i_K$, so that a cathode terminal voltage $V_K$ rises. When the rising pulse voltage signal of the cathode terminal voltage $V_K$ is input to the second terminal b of the logical product circuit 3, an output signal is produced from the logical product circuit 3 which has the input signal $V_{IN}$ already applied to the first terminal a. This output signal is fed back to the second terminal b via the rectifying circuit 4 and the feedback resistor Rf, so that the output signal from the logical product circuit 3 is self held. Hence an output signal continues to be produced until the input signal $V_{IN}$ is cancelled. In this way, an output signal Z is produced from the self hold circuit 2 as a delay output signal for the on-delay circuit, delayed by a predetermined time $\tau_1$ from after applying the input signal $V_{IN}$ to the PUT oscillation circuit 1, based on a timing output signal from the PUT oscillation circuit 1.

Once the capacitor $C_1$ has been discharged to a certain level, the PUT again goes off, and the PUT oscillation circuit 1 again becomes condition A. While the input signal $V_{IN}$ is being applied, the PUT oscillation circuit 1 switches back and forth between condition A and condition B, while when the input signal $V_{IN}$ is cancelled, the PUT oscillation circuit 1 becomes a condition C existing prior to applying the input signal $V_{IN}$. In FIG. 15, symbol $i_{B2}$ denotes a bias current flowing via the resistor $R_4$.

With the construction however, as with the conventional on-delay circuit shown in FIG. 15 where after a predetermined time $\tau_1$ from inputting the input signal $V_{IN}$, only the pulse voltage signal produced at the cathode terminal of the PUT is input directly to the second terminal b of the logical product circuit 3, then if for example during timing, a short circuit fault occurs between the gate terminal and the cathode terminal, or between the anode terminal and the cathode terminal of the PUT, an erroneous PUT cathode voltage signal will be produced. There is thus the problem that an erroneous delay output signal is produced, and hence the circuit is not fail-safe. This problem is even mentioned in Japanese Unexamined Patent Publication No. 2-141122.

In Japanese Unexamined Patent Publication No. 2-141122, in order to solve this problem, the cathode voltage signal and the gate voltage signal are respectively input to different self hold circuits, and the logical product output from the two self hold circuits is made the delay output signal. With such a circuit configuration, even if during timing after applying the input voltage $V_{IN}$, a short circuit fault occurs between the gate terminal and the cathode terminal, there is no generation of an erroneous delay output signal. However with the circuit configuration of this conventional example, when the input signal $V_{IN}$ is cancelled, a capacitor for continually producing a differential signal is charged. Therefore, if the input signal $V_{IN}$ is applied in the condition with a short circuit fault occurring between the gate terminal and the cathode terminal of the PUT, there can be a problem of an erroneous delay output signal being produced having practically no delay time. Moreover there can be a problem in that, under conditions where the capacitor for setting the oscillation time constant of the PUT oscillation circuit has practically no charge, if a short circuit fault occurs simultaneously between the anode terminal and the gate terminal and the cathode terminal of the PUT, then when the input signal $V_{IN}$ is applied, the gate voltage signal will initially drop to become approximately a power source potential Vcc, after which it will rise. Therefore depending on the threshold value in an operational oscillator comprising a self hold circuit, there is the possibility of an erroneous delay output signal being produced.

With the circuit of Japanese Unexamined Patent Publication No. 2-141122, there is thus the problem that if a fault occurs in one of the constituent elements of the circuit, an erroneous delay output can be produced. Moreover, using two self hold circuits having operational oscillators causes an increase in cost, and is thus undesirable.

As is clear from the earlier discussion, when the beforementioned PUT oscillation circuit is operating normally, it changes from condition A to condition B and then returns again to condition A, while at the time of a fault, it remains in condition A or only changes from condition A to condition B. Therefore using these characteristics of an oscillation circuit, it is possible to verify if the PUT oscillation circuit is operating normally, As a method for verifying normal operation of a PUT oscillation circuit using these characteristics, it has been considered to use for example the signal information of (1) and (2) below:

(1) a characteristic signal (voltage or current) condition produced only when the PUT oscillation circuit is operating normally, that is to say changes from condition A to condition B and then again to condition A (normal oscillation operation).

(2) a sequential change in the voltage and current condition of the various parts of the circuit due to the PUT oscillation circuit operating normally, that is to say changing from condition A to condition B and then again to condition A (normal oscillation operation).

The present invention takes into consideration the above situation with the object of providing a fail-safe timing circuit which does not produce an erroneous timing output at the time of a fault, by providing a monitoring circuit for verifying if an oscillation circuit is operating normally by monitoring a voltage signal change condition which is based on the operating characteristics of the oscillation circuit. Moreover it is an object of the invention to provide a fail-safe on-delay circuit which does not produce an erroneous delay output at the time of a fault, by combining a logical product circuit with the fail-safe timing circuit.

DISCLOSURE OF THE INVENTION

Accordingly, the timing circuit of the present invention is characterized in comprising: an oscillation circuit which produces an oscillating output using the switching of a switching element, after the lapse of a previously set predetermined time from after applying an input signal; and a monitoring circuit for monitoring for the normalcy of the oscillation circuit based on electrical operating conditions of the oscillation circuit, and generating an output signal only when the oscillation circuit is normal.

With such a construction, an output signal is generated from the monitoring circuit if the oscillation circuit is operating normally. Hence it can be known if the oscillation circuit is normal, from the output conditions of the monitoring circuit.

With the timing circuit, the construction may be such that a signal from the oscillation circuit, and the input signal are input to the monitoring circuit.

With such a construction, whether or not the input signal is being applied to the timing circuit can be verified in the monitoring circuit by a dual system, involving a signal from the oscillation circuit and a directly input input signal.

With the present invention, the construction may be such that the monitoring circuit monitors for the normalcy of the oscillation circuit based on a signal change which is produced only when the oscillation circuit is operating normally, and when the oscillation circuit is a PUT oscillation circuit which uses a PUT for the switching element, there is provided: a differentiating circuit for differentiating a cathode terminal voltage of the PUT; a photocoupler comprising a photodiode with an anode side connected to a constant voltage line and a cathode side connected to an output terminal of the differentiating circuit, and a phototransistor with a collector side connected to the constant voltage line via a resistor, and an emitter side connected to earth; and a level conversion circuit comprising a capacitor and a diode with the capacitor connected between an intermediate point between the resistor and the phototransistor and a cathode side of the diode, and an anode side of the diode connected to the constant voltage line, and an output signal from the level conversion circuit is made the output signal from the monitoring circuit.

With such a construction, a falling change in the cathode voltage of the PUT which is only produced when the oscillation circuit is normal can be verified, and an output signal indicating the normalcy of the oscillation circuit then generated.

Moreover with the present invention, as a concrete configuration for where the signal from the oscillation circuit and the input signal are input to the monitoring circuit, the construction may be such that the monitoring circuit monitors for the normalcy of the oscillation circuit based on a signal change which is produced only when the oscillation circuit is operating normally, and when the oscillation circuit is a PUT oscillation circuit which uses a PUT for the switching element, there is provided: a differentiating circuit for differentiating a cathode terminal voltage of the PUT; a photocoupler comprising a photodiode with an anode side connected to a constant voltage line and a cathode side connected to an output terminal of the differentiating circuit, and a phototransistor with a collector side connected via a resistor to an input signal line to which the input signal is applied, and an emitter side connected to the constant voltage line; and a level conversion circuit comprising a capacitor and a diode with the capacitor connected between an intermediate point between the resistor and the phototransistor and a cathode side of the diode, and an anode side of the diode connected to the input signal line, and an output signal from the level conversion circuit is made the output signal from the monitoring circuit.

With such a construction, whether or not the input signal is being applied to the timing circuit can be verified in the monitoring circuit by a dual system, involving a signal from the oscillation circuit and a directly input input signal.

With the present invention the construction may be such that the monitoring circuit monitors for the normalcy of the oscillation circuit based on a sequential signal change in the various parts of the oscillation circuit for when the oscillation circuit is operating normally, and when the oscillation circuit is a PUT oscillation circuit which uses a PUT for the switching element, there is provided: a photocoupler comprising a photodiode and a phototransistor, for detecting the presence of a gate current of the PUT of the oscillation circuit; a voltage dividing circuit for dividing a cathode voltage of the PUT; a transistor with an emitter side connected to a constant voltage line and a collector side connected to a collector side of the phototransistor, and a voltage divided by the voltage dividing circuit input to a base terminal; and a level conversion circuit comprising a capacitor and a diode with the capacitor connected between an intermediate point between the transistor and the phototransistor and a cathode side of the diode, and an anode side of the diode connected to the constant voltage line, and an output signal from the level conversion circuit is made the output signal from the monitoring circuit.

With such a construction, a sequential change in the gate current and the cathode voltage when the oscillation circuit is operating normally can be verified, and an output signal indicating the normalcy of the oscillation circuit then generated.

With the present invention, the construction may be such that the monitoring circuit monitors for the normalcy of the oscillation circuit based on a sequential signal change in the various parts of the oscillation circuit for when the oscillation circuit is operating normally, and when the oscillation circuit is a PUT oscillation circuit which uses a PUT for the switching element, there is provided: a first photocoupler comprising a first photodiode and a first phototransistor, for detecting the presence of a gate current of the PUT of the oscillation circuit; a second photocoupler comprising a second photodiode and a second phototransistor, for detecting the presence of an anode current of the PUT of the oscillation circuit; a voltage dividing circuit for dividing a cathode voltage of the PUT; a transistor with an emitter side connected to a constant voltage line and a collector side connected to a collector side of the second phototransistor, and a voltage divided by the voltage dividing circuit input to a base terminal; and a level conversion circuit comprising a capacitor and the first phototransistor with the capacitor connected between an intermediate point between the transistor and the second phototransistor and an emitter side of the first phototransistor, and a collector side of the first phototransistor connected to the constant voltage line, and an output signal from the level conversion circuit is made the output signal from the monitoring circuit.

With such a construction, a sequential change in the gate current, the anode current and the cathode voltage for when the oscillation circuit is operating normally can be verified, and an output signal indicating the normalcy of the oscillation circuit then generated.

With the present invention the construction may be such that the monitoring circuit monitors for the normalcy of the oscillation circuit based on a sequential signal change in the various parts of the oscillation circuit for when the oscillation circuit is operating normally, and when the oscillation circuit is a PUT oscillation circuit which uses a PUT for the switching element, there is provided: a photocoupler comprising a photodiode and a phototransistor, for detecting the presence of a gate current of the PUT of the oscillation circuit; a voltage dividing circuit for dividing a cathode voltage of the PUT; a transistor with an emitter side connected to a constant voltage line and a collector side connected to a collector side of the phototransistor, and a voltage divided by the voltage dividing circuit input to a base terminal; and a level conversion circuit comprising a capacitor and a diode with the capacitor connected between an intermediate point between the transistor and the phototransistor and a cathode side of the diode, and an anode side of the diode connected to the input signal line, and an output signal from the level conversion circuit is made the output signal from the monitoring circuit.

With such a construction, whether or not the input signal is being applied to the timing circuit can be verified by a dual system in the monitoring circuit, involving a signal from the oscillation circuit and a directly input input signal.

With the present invention, the construction may be such that the monitoring circuit monitors for the normalcy of the oscillation circuit based on a sequential signal change in the various parts of the oscillation circuit for when the oscillation circuit is operating normally, and when the oscillation circuit is a PUT oscillation circuit which uses a PUT for the switching element, there is provided: a first photocoupler comprising a first photodiode and a first phototransistor, for detecting the presence of a gate current of the PUT of the oscillation circuit; a second photocoupler comprising a second photodiode and a second phototransistor, for detecting the presence of an anode current of the PUT of the oscillation circuit; a voltage dividing circuit for dividing a cathode voltage of the PUT; a transistor with an emitter side connected to a constant voltage line and a collector side connected to a collector side of the second phototransistor, and a voltage divided by the voltage dividing circuit input to a base terminal; and a level conversion circuit comprising a capacitor and the first phototransistor with the capacitor connected between an intermediate point between the transistor and the second phototransistor and an emitter side of the first phototransistor, and a collector side of the first phototransistor connected to an input signal line, and an output signal from the level conversion circuit is made the output signal from the monitoring circuit.

With the present invention, the construction may be such that the monitoring circuit monitors for the normalcy of the oscillation circuit based on a sequential signal change in the various parts of the oscillation circuit for when the oscillation circuit is operating normally, and when the oscillation circuit is a PUT oscillation circuit which uses a PUT for the switching element, there is provided: a photocoupler comprising a photodiode and a phototransistor, for detecting the presence of an anode current of the PUT of the oscillation circuit; and a level conversion circuit comprising a capacitor and the phototransistor of the photocoupler, with one end of the capacitor connected to an emitter side of the phototransistor which has a collector side connected to an input signal line, and a gate voltage applied to an other end of the capacitor, and an output signal from the level conversion circuit is made the output signal from the monitoring circuit.

With such a construction, whether or not the input signal is being applied to the timing circuit can be verified in the monitoring circuit by a dual system, involving a signal from the oscillation circuit and a directly input input signal.

With the present invention, the oscillation circuit may be a one shot multi-vibrator.

With the on-delay circuit according to the present invention, the construction incorporates the abovementioned timing circuit of the present invention, together with a self hold circuit with the input signal for input to the timing circuit input to a first terminal, and the output signal from the monitoring circuit input to a second terminal, which produces an output signal when the input signals input to the first and second terminals are both higher than a power source potential, and which feeds back the output signal to the second terminal to self hold the output signal, and the output signal from the self hold circuit is made a delay output signal.

With such a construction, only when the timing circuit is normal, is an input signal which is a higher level than the power source potential, applied to the second terminal of the self hold circuit and an output signal thus produced, and this output signal then self held and output as a delay output signal.

Moreover, with the on-delay circuit according to the present invention, the construction may be such that an input signal line of the timing circuit and an input signal line to the first terminal of the self hold circuit are in separate systems, and a resistance is disposed in at least one of the input signal lines.

With such a construction, in the case of a short circuit fault in an element connected between the input signal line to the first terminal of the self hold circuit and the second terminal, it is possible to prevent the self hold output from being fed back to the second terminal being applied to the first terminal. Hence a loss in dependence of the operation of the self hold circuit on the input signal can be prevented.

BEST MODE FOR CARRYING OUT THE INVENTION

As follows is a description of embodiments of the present invention, with reference to the drawings.

Figure 1:
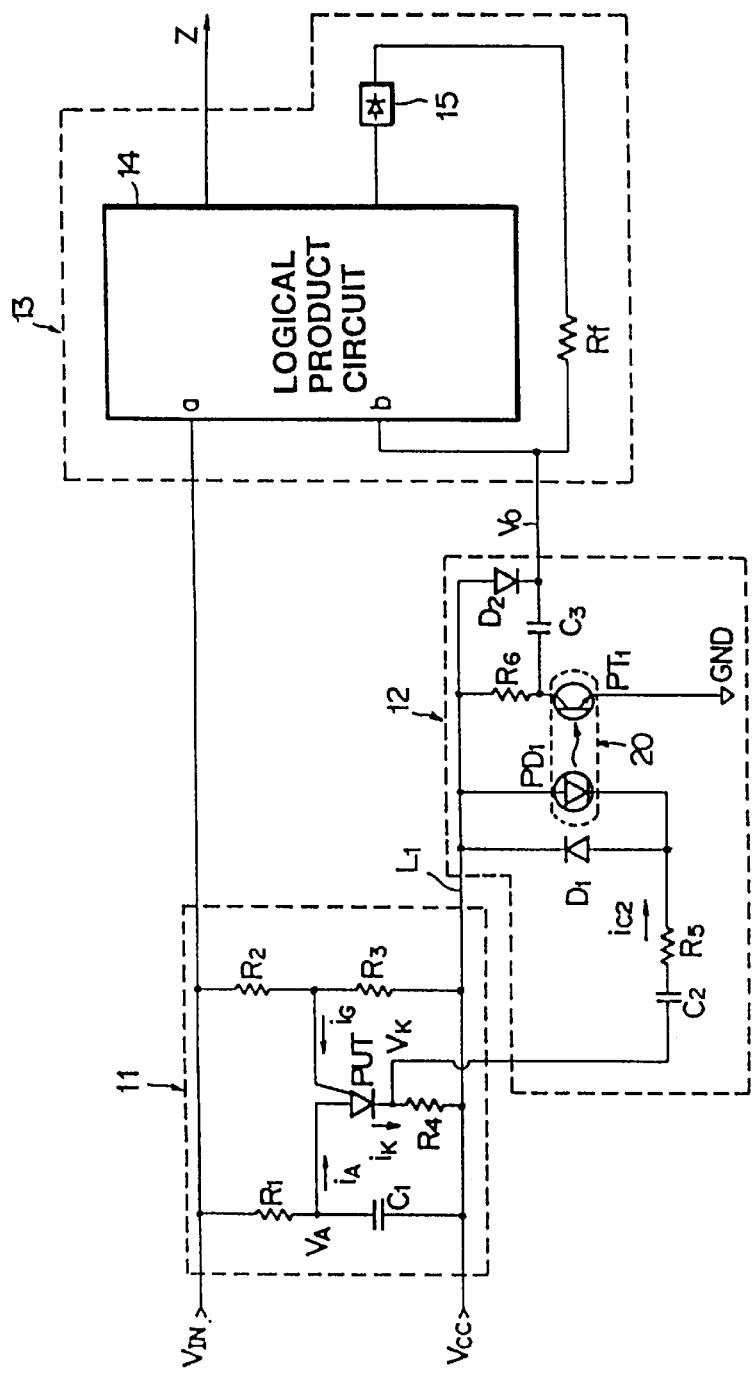
FIG. 1 is a circuit diagram of an on-delay circuit of a first embodiment according to the present invention.

FIG. 1 shows a circuit of a first embodiment of an on-delay circuit which utilizes a timing circuit, according to the present invention. This is a circuit example for where a monitoring circuit is used, which carries out monitoring of a PUT oscillation circuit using a characteristic signal change which is produced only when the PUT oscillation circuit is operating normally.

In FIG. 1, the on-delay circuit of this embodiment comprises; a timing circuit made up of a monitoring circuit 12 and a PUT oscillation circuit 11 which uses a PUT as a switching element, as well as a self hold circuit 13.

Figure 15:
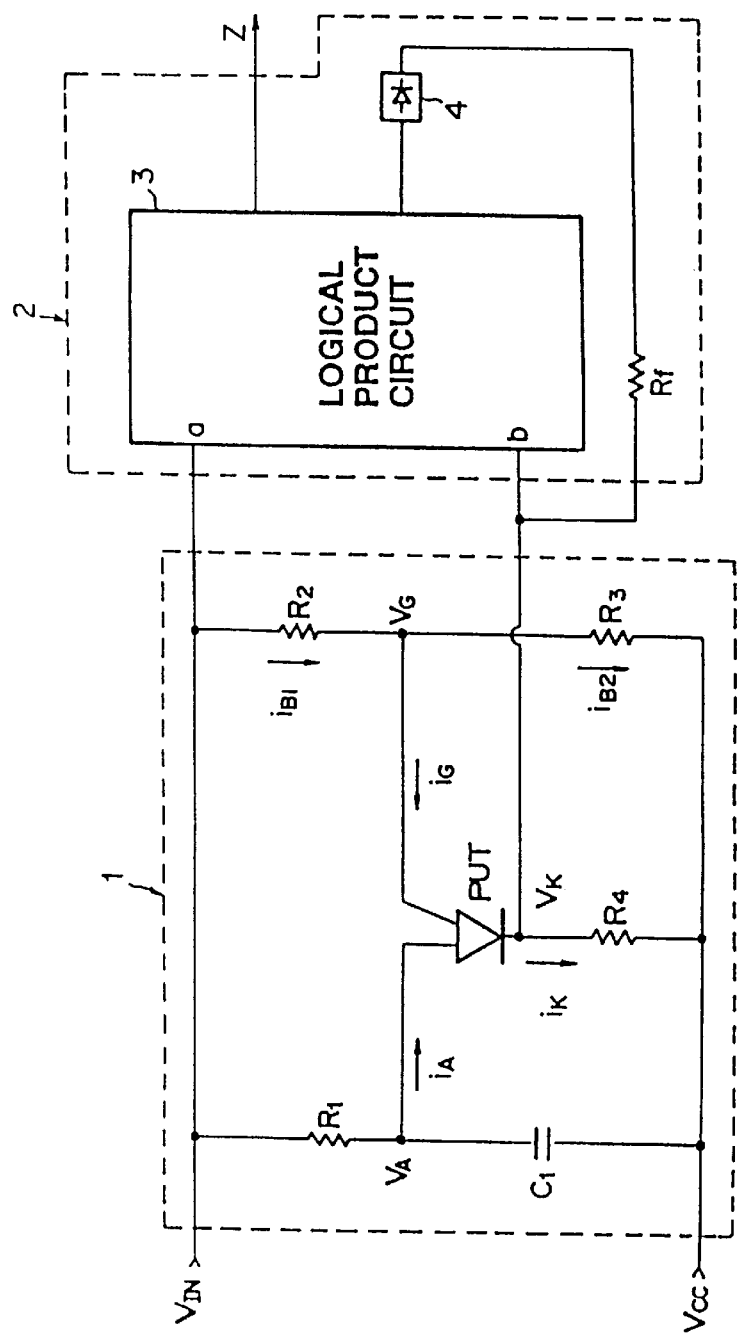
FIG. 15 is a circuit example of a conventional on-delay circuit.

The PUT oscillation circuit 11 has the same construction as the conventional circuit shown in FIG. 15, comprising resistors $R_1 \sim R_4$, a capacitor $C_1$, and a PUT, and produces an oscillating output based on the conduction and non conduction of the PUT.

The monitoring circuit 12 comprises: a capacitor $C_2$ with one end connected to an intermediate point between a cathode terminal of the PUT of the PUT oscillation circuit 11 and the resistor $R_4$; a resistor $R_5$ connected to the other end of the capacitor $C_2$; a photocoupler 20 comprising a photodiode $PD_1$ with an anode side connected to a constant voltage line $L_1$ to which a power source potential Vcc is applied, and a cathode side connected to the resistor $R_5$, and a phototransistor $PT_1$ with a collector side connected to the constant voltage line $L_1$ via a resistor $R_6$, and an emitter side connected to earth (shown as GND in the figure); a diode $D_1$ with a cathode side connected to the constant voltage line $L_1$ in parallel with the photodiode $PD_1$ of the photocoupler 20 and an anode side connected to an intermediate point between the resistor $R_5$ and the cathode side of the photodiode $PD_1$; a capacitor $C_3$ with one end connected to an intermediate point between the resistor $R_6$ and the phototransistor $PT_1$; and a diode $D_2$ with a cathode side connected to the other end of the capacitor $C_3$, and an anode side connected to the constant voltage line $L_1$. Here the capacitor $C_2$ and the resistor $R_5$ constitute a differentiating circuit for differentiating the cathode voltage $V_K$ of the PUT, while the capacitor $C_3$ and the diode $D_2$ constitute a level conversion circuit for level converting the output from the photocoupler 20.

The self hold circuit 13 has the same construction as the conventional circuit shown in FIG. 15, comprising; a logical product circuit 14 having two signal input terminals a, b, and a rectifying circuit 15 and a feedback resistor Rf for feeding back an output from the logical product circuit 14 to the second terminal b so that the output is self held.

Next is a description of the logical product circuit 14.

The logical product circuit 14 is a two input AND gate with the two inputs (terminals) each having at least a predetermined lower limit threshold value (higher than the power source potential Vcc). An output is only produced when signals of a potential equal to or above the respective lower limit threshold values are input to the two input terminals. Furthermore, with the fail-safe on-delay circuit there is required the characteristic that even with a fault in the logical product circuit, there is no erroneous oscillation, in spite of the input signals not being applied to the two input terminals.

For this type of logical product circuit, a fail-safe window comparator/AND gate can be used. A fail-safe window comparator circuit and its operation are disclosed in Trans. IEE of Japan, Vol. 109-C, No. 9 September 1989 under the heading, "A Structural Method for an Interlock System using a Fail-Safe Logic Element having Window Characteristics". Moreover this is also disclosed in literature such as the Proc. of 19th International Symp. on Multiple-Valued Logic, IEEE Computer Society (May 1989) under the heading of "Application of Window Comparator to Majority Operation", and the IEEE Transaction on Instrumentation and Measurement, vol. 38, No. 2 (April, 1989) under the heading of "Realization of Fail-Safe Train Wheel Sensor Using Electromagnetic Induction". Furthermore, a two input fail-safe window comparator implemented by an LSI is disclosed in IEICE Trans. Electron., vol, E76-C, No. 3, Mar. 1993, pp. 419–427 under the heading of "LSI Implementation and Safety Verification of Window Comparator Used in Fail-Safe Multiple-Valued Logic Operation". The fail-safe window comparator circuit has also been previously disclosed in U.S. Pat. No. 4,661,880, U.S. Pat. No. 5,027,114 and in Japanese Examined Patent Publication No. 1-23006.

Figure 2:
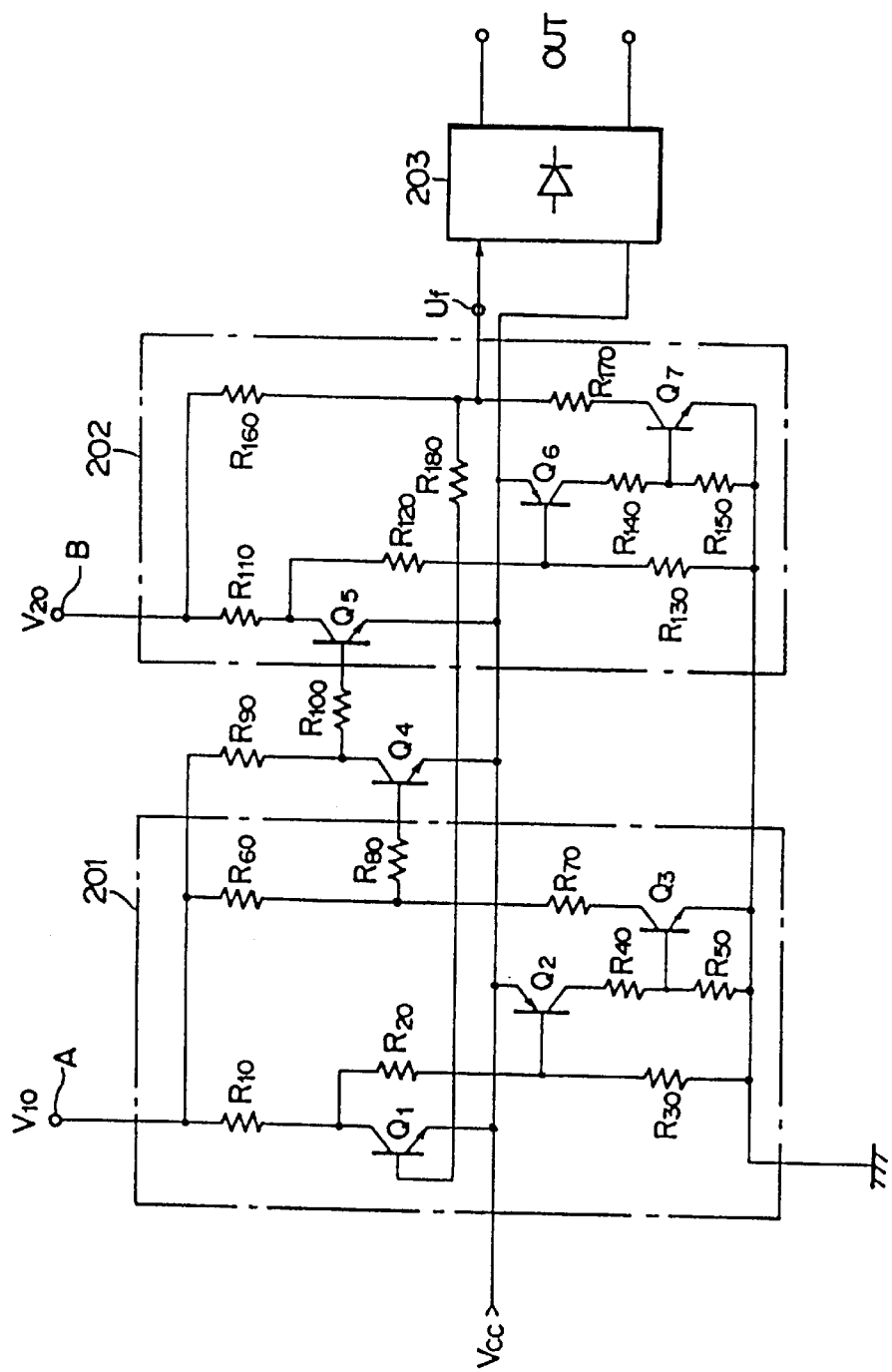
FIG. 2 is a circuit example of a logical product circuit.

A representative circuit example is shown in FIG. 2, and details of its operation are given below.

In FIG. 2, symbols R10, R20 through R170, R180 indicate resistors, Q1 through Q7 indicate transistors, A, B indicate input terminals (corresponding to input terminals a, b of the logical product circuit 14), Vcc indicates the power source potential for the window comparator, and numeral 203 indicates a rectifying circuit. The parts in FIG. 2 outlined by chain lines are direct-coupled direct current amplifying circuits 201, 202 which use respective transistors Q1, Q2, Q3, and Q5, Q6, Q7. Moreover, a transistor Q4 constitutes a phase inversion circuit (inverter), and has the function of inverting and amplifying the output signal from the direct current amplifying circuit 201. The direct current amplifying circuit 201 is connected to the direct current amplifying circuit 202 by way of the transistor Q4, and the output from the direct current amplifying circuit 202 is direct-coupled to the direct current amplifying circuit 201 by way of the resistor R180, thus making up a feedback oscillation circuit.

Conditions for oscillation of the circuit of FIG. 2 are determined by the following equations, where V10 is the input potential of the input terminal A, and V20 is the input potential of the input terminal B;

For the input terminal A $$(r_{10}+r_{20}+r_{30})Vcc/r_{30} < V_{10} < (r_{60}+r_{70})Vcc/r_{70} \quad (1)$$

For the input terminal B, $$(r_{110}+r_{120}+r_{130})Vcc/r_{130} < V_{20} < (r_{160}+r_{170})Vcc/r_{170} \quad (2)$$

In the above two equations, $r_{10}$ through $r_{170}$ indicate the resistance values of the respective resistors. Moreover, symbol < means less than or approximately equal. In equation (1) $(r_{10}+r_{20}+r_{30})Vcc/r_{30}$ represents the approximate lower limit threshold value of the input terminal A, while $(r_{60}+r_{70})Vcc/r_{70}$ represents the approximate upper limit threshold value of the input terminal A. In a similar manner, $(r_{110}+r_{120}+r_{130})Vcc/r_{130}$ in equation (2) represents the approximate lower limit threshold value of the input terminal B, while $(r_{160}+r_{170})Vcc/r_{170}$ represents the approximate upper limit threshold value of the input terminal B. When the input terminal A has an input level V10 within a range satisfying equation (1), and the input terminal B has an input level V20 within a range satisfying equation (2), the circuit of FIG. 2 oscillates and an alternating current output signal is produced at a terminal Uf. This alternating current output signal is rectified in the rectifying circuit 203 to become a direct current output signal.

The oscillation process in the circuit of FIG. 2 occurs when the voltage levels of the input signals to the input terminals A and B both satisfy equations (1) and (2), and the transistors Q1 to Q7 are switched for example as follows: Q6:OFF→Q7:OFF→Q1:ON→Q2:ON→Q3:ON→Q4: OFF→Q5:ON→Q6:ON→Q7:ON→Q1:OFF→Q2:OFF→ Q3:OFF→Q4:ON→Q5:OFF→Q6:OFF→ and so on.

The circuit of FIG. 2, has the characteristic that even if a short circuit or disconnection fault occurs in the transistors and resistors which make up the circuit; "there is no situation wherein oscillation erroneously occurs even in spite of the input voltages determined by equations (1) and (2) not being supplied to the two input terminals A and B". For example, it has the characteristic that if any one of the transistors Qi (i=1~7) is faulty, then the phase of the feedback loop is inverted so that a feedback oscillation cannot be produced. Moreover, insofar as an input voltage at the respective input terminals A and B which is higher than the power source potential Vcc, is not supplied to the collector side of the transistors Q1, Q3, Q4 and the transistors Q5, Q7, then switching signals cannot be output to the bases of the transistors succeeding these transistors, and oscillation is thus not possible.

The rectifying circuit 203 of FIG. 2 rectifies the AC output signal produced due to oscillation of the direct current amplifying circuit 202, to give a direct current output signal. The method of rectifying the oscillating output signal to give a direct current output signal includes both the case where the output signal from the oscillation circuit of FIG. 2 is amplified before inputting to the rectifying circuit, and the case where this is input to the rectifying circuit via a transformer. Moreover, in FIG. 2, a phase inversion amplifying circuit comprising the transistor Q4 is inserted as an inverter between, but separate from, the two direct current amplifying circuits 201, 202. This phase inversion amplifying circuit may however be incorporated into one of the two direct current amplifying circuits.

With this embodiment, the self hold circuit 13 is constructed such that the AC signal from the terminal Uf shown in FIG. 2 of the logical product circuit 14, is input to the rectifying circuit 15 and rectified, and then input to the second terminal b via the feedback resistor Rf. Furthermore, the output from the rectifying circuit 203 becomes the delay output signal from the self hold circuit 13.

With the monitoring circuit 12 of the present embodiment, the normalcy of the PUT oscillation circuit 11 is verified by monitoring the cathode terminal voltage $V_K$ of the PUT oscillation circuit 11.

Figure 16:
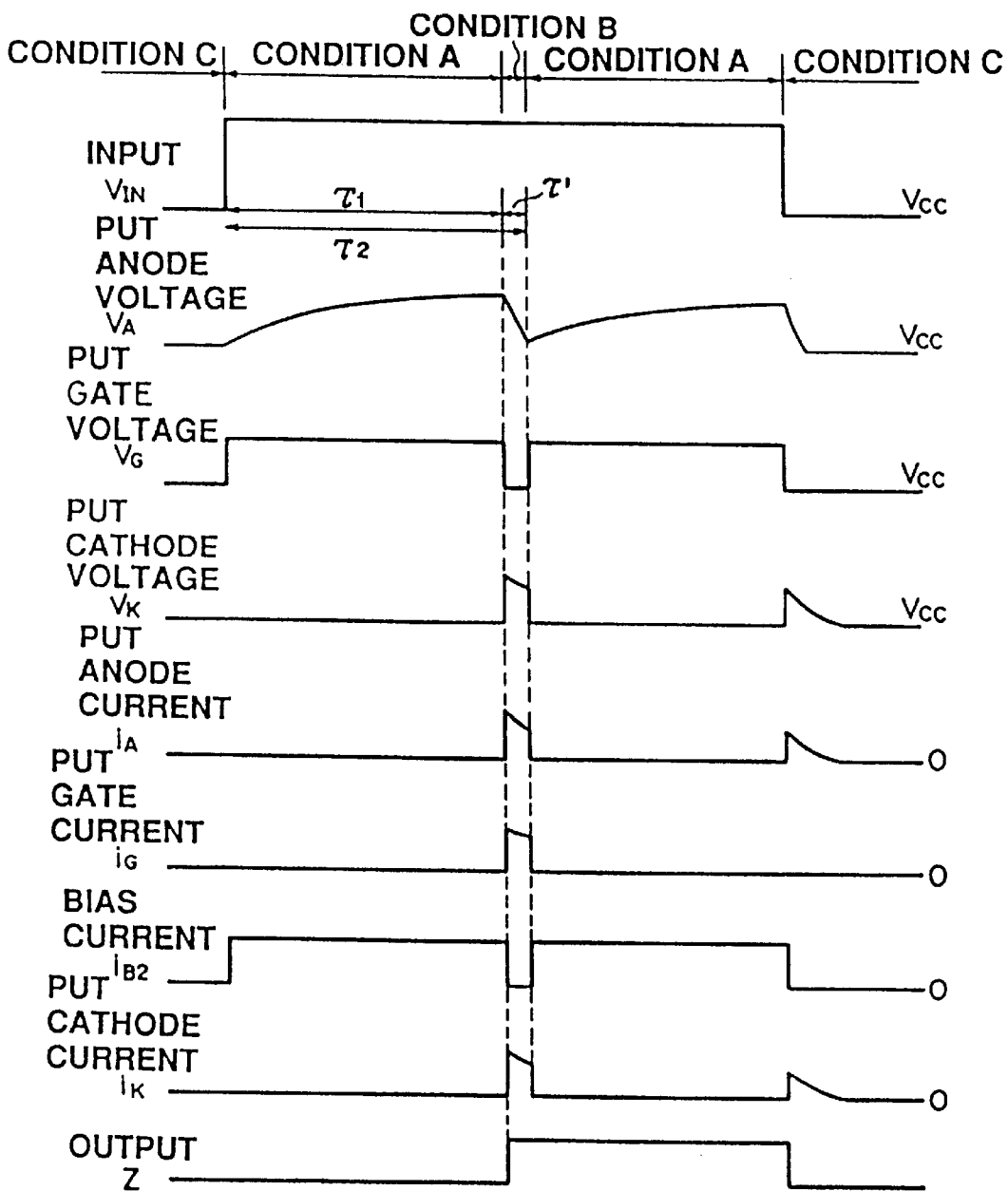
FIG. 16 is an operation time chart for the circuit of FIG. 15.

That is to say, as shown by the operation time chart (refer to FIG. 16) of the conventional circuit of FIG. 15, the PUT cathode terminal voltage $V_K$ of the PUT oscillation circuit rises steeply at a time $\tau_1$ from after applying the input signal $V_{IN}$, and then falls steeply at a time $\tau_2$. If a fault occurs in the PUT oscillation circuit, the steep drop as is seen at the time $\tau_2$ does not occur in the cathode terminal voltage $V_K$. For example, if a short circuit fault occurs between the gate terminal and the cathode terminal of the PUT during timing after applying the input signal $V_{IN}$, then the cathode terminal voltage $V_K$ will only rise and will not fall. Also, if the input signal $V_{IN}$ is applied in a condition with a short circuit fault occurring between the gate terminal and the cathode terminal, the same happens. Furthermore, also if a short circuit fault occurs between the anode terminal, the gate terminal and the cathode terminal of the PUT during timing, there will be no steep drop of the cathode terminal voltage $V_K$. Consequently if the construction is such that the cathode terminal voltage $V_K$ is input to the monitoring circuit 12, and an output signal is only output to the self hold circuit 13 when verified that there has been a steep drop in the cathode terminal voltage $V_K$, then a fail-safe on-delay circuit can be realized.

Figure 3:
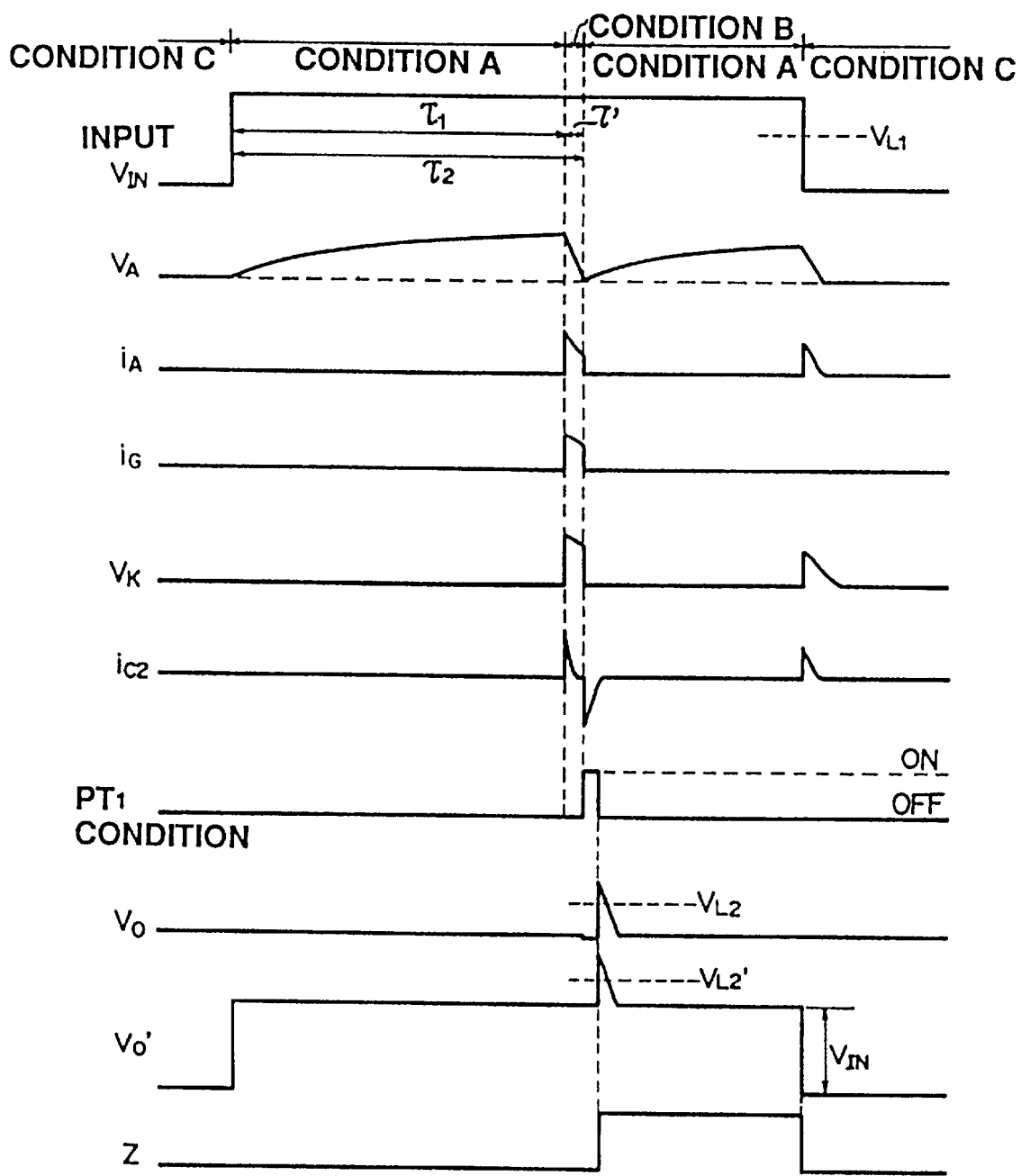
FIG. 3 is an operation time chart for the first embodiment.

Next is a description of the operation of the on-delay circuit of the first embodiment, with reference to the operation time chart of FIG. 3. In the description, the application of the input signal $V_{IN}$ is indicated by the voltage level of the input signal $V_{IN}$ becoming equal to or above a lower limit threshold value $V_{L1}$ held by the first terminal a of the logical product circuit 14, while the cancelling of the input signal $V_{IN}$ is indicated by the voltage level of the input signal $V_{IN}$ becoming less than the lower limit threshold value held by the first terminal a of the logical product circuit 14. The operation of the PUT oscillation circuit 11 is the same as for the PUT oscillation circuit 1 of the conventional circuit shown in FIG. 15, and hence description is omitted.

With the monitoring circuit 12, the PUT cathode terminal voltage $V_K$ is differentiated by the capacitor $C_2$ and the resistor $R_5$ and converted to a current $i_{C2}$. The current $i_{C2}$ is a positive value when flowing in the direction indicated by the arrow in FIG. 1. As shown in FIG. 3, due to the rising of the cathode terminal voltage $V_K$ when the PUT oscillation circuit 11 changes from condition A to condition B, a positive pulse current flows as the current $i_{C2}$, while due to the falling of the cathode terminal voltage $V_K$ when changing from condition B to condition A, a negative pulse current flows as the current $i_{C2}$. In the case where the input signal $V_{IN}$ is not applied (condition C), or when applied but timing is being carried out (condition A), then the cathode terminal voltage $V_K$ keeps a constant value and does not change, and hence the current $i_{C2}$ is zero.

When the negative pulse current is produced when changing from condition B to condition A, this negative current $i_{C2}$ flows via the photodiode $PD_1$, causing the phototransistor $PT_1$ to come on. The impedance of the phototransistor $PT_1$ at this time is set so as to become less than the resistance of the resistor $R_6$. Therefore, the collector terminal voltage of the phototransistor $PT_1$ drops to become approximately GND level. Furthermore, since the cathode terminal voltage of the diode $D_2$ is approximately the power source potential Vcc, then the capacitor $C_3$ is charged via the diode $D_2$ and the phototransistor $PT_1$, to the power source potential Vcc. When the differential operation is completed and the current flowing in the photodiode $PD_1$ ceases, the phototransistor $PT_1$ goes off resulting in a higher impedance than the resistance of the resistor $R_6$. Therefore the collector terminal voltage of the phototransistor $PT_1$ rises and becomes approximately the power source potential Vcc. This change in the collector terminal voltage of the phototransistor $PT_1$ is level converted by the capacitor $C_3$ so that a pulse voltage signal of approximately two times the frequency of the power source potential Vcc is produced as the output signal Vo. This pulse voltage Vo which has a level equal to or greater than a lower limit threshold value $V_{L2}$ of the second terminal b of the logical product circuit 14, is then input to the second terminal b of the logical product circuit 14.

When the pulse voltage Vo is input to the second terminal b under the condition that the input signal $V_{IN}$ is being applied to the first terminal a of the logical product circuit 14, then the logical product circuit 14 generates an output signal Z (delay output signal of the on-delay circuit). That is to say, the delay output signal Z of the on-delay circuit is produced after the elapse of time $\tau_2$ ($=\tau_1+\tau'$) from after input of the input signal $V_{IN}$ to the PUT oscillation circuit 11. The AC signal from the logical product circuit 14 is rectified by the rectifying circuit 15 simultaneously with the generation of the output signal Z, and then fed back via the feedback resistor Rf to the second terminal b of the logical product circuit 14. Due to the input of this feedback signal to the second terminal b, the output signal Z continues to be produced while the input signal $V_{IN}$ is being applied to the first terminal a, even after the pulse voltage Vo is cancelled. If the input signal $V_{IN}$ is cancelled, the output signal Z as well as the feedback signal are simultaneously cancelled.

If a fault occurs in the PUT oscillation circuit 11, there will be no steep drop in the cathode terminal voltage $V_K$ of the PUT. If appropriate values are selected for the capacitor $C_2$ and the resistor $R_5$, so that in the case where the cathode terminal voltage $V_K$ does not drop steeply, the current flowing in the photodiode $PD_1$ is made sufficiently small and the impedance of the phototransistor $PT_1$ is kept higher than the resistance of the resistor $R_6$, then the collector terminal voltage of phototransistor $PT_1$ will not change and will be kept at approximately the power source potential Vcc. Hence the capacitor $C_3$ will not be noticeably charged, and an output signal Vo of a level equal to or above the lower limit threshold value $V_{L2}$ of the second terminal b of the logical product circuit 14 will not be produced.

Also if a fault occurs in the monitoring circuit 12, an erroneous output will not be produced. For example if a disconnection fault occurs in the capacitor $C_2$ or the resistor $R_5$ or the photodiode $PD_1$, the signal will not be transmitted and the phototransistor $PT_1$ will thus become a continuous high impedance. Hence an erroneous output will not be produced. Furthermore, if a short circuit fault occurs in the capacitor $C_2$, since the cathode terminal voltage $V_K$ is always equal to or above the power source potential Vcc, a current will not flow in the photodiode $PD_1$, and the phototransistor $PT_1$ will thus become a high impedance. Hence an erroneous output will not be produced.

Figure 4:
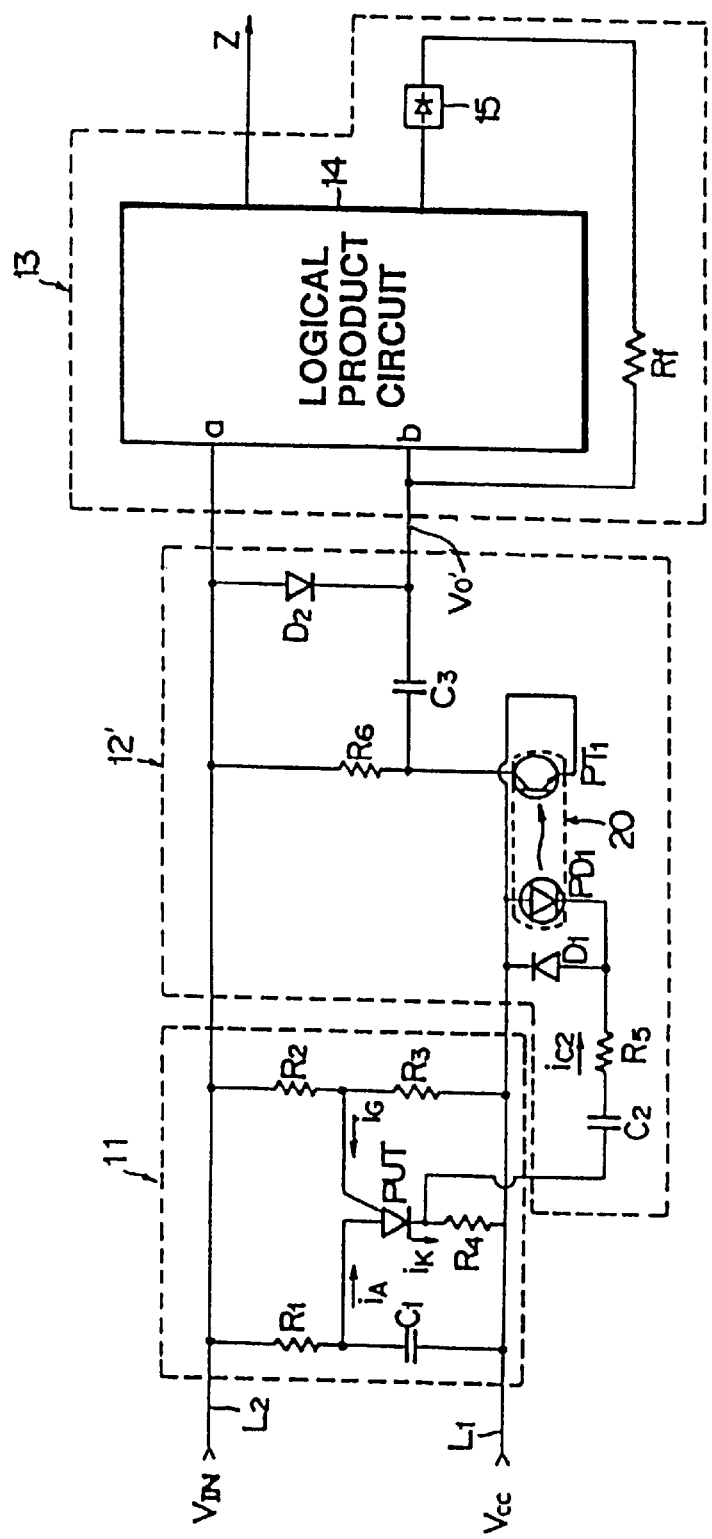
FIG. 4 is a circuit diagram of an on-delay circuit of a second embodiment according to the present invention.

Utilizing the fact that the input and output of the monitoring circuit 12 are insulated from each other by the photocoupler 20, then it is possible to have a monitoring circuit 12' instead as shown in FIG. 4, made up of the circuit which comprises the resistor $R_6$, the phototransistor $PT_1$, the capacitor $C_3$ and the diode $D_2$, inserted between the power source and GND, and is inserted between an input line $L_2$ for the input signal $V_{IN}$ and the fixed voltage line $L_1$.

In the case of the construction of the monitoring circuit 12' of FIG. 4 which illustrates a second embodiment of the present invention, a pulse voltage signal Vo' produced following the voltage change in the collector terminal side of the phototransistor $PT_1$, is superimposed on the input signal $V_{IN}$ as shown in the operation time chart of FIG. 3. Therefore, by verifying the voltage level of the pulse voltage signal Vo', verification of the timing operation, and that the input signal $V_{IN}$ is being applied, can be carried out simultaneously (dual system). There is thus the advantage that the fail-safe characteristics are improved. Needless to say, with the circuit configuration of FIG. 4, there is the proviso that a lower limit threshold value $V_{L2}'$ of the second terminal b of the logical product circuit 14 must be set to a higher value than the lower limit threshold value $V_{L2}$ for FIG. 1.

Now, instead of the diode $D_1$ used in the circuit of FIG. 1 and FIG. 4, a resistor may be used.

Next is a description of a circuit example which uses a monitoring circuit which carries out monitoring of the PUT oscillation circuit based on a sequential signal change for when the PUT oscillation circuit is operating normally.

At first is a description concerning the structural theory of a relevant monitoring method.

The number of input signals required for the monitoring circuit to monitor for the operation normalcy of the PUT oscillation circuit in the case where the fact the PUT is oscillating normally (that is to say changes from condition A to condition B and then back to condition A) is verified using the sequential changes in the voltage or the current condition of the various part of the circuit, is explained below using the conventional basic PUT oscillation circuit shown in FIG. 15.

The currents in the PUT oscillation circuit are the anode current $i_A$, the gate current $i_G$, the cathode current $i_K$, the bias current $i_{B1}$, and the bias current $i_{B2}$. The charging current flowing through the resistor $R_1$ is normally smaller than the other currents and hence is not considered here. The voltages are the anode voltage $V_A$, the cathode voltage $V_K$, and the gate voltage $V_G$.

All of these five currents and three voltages can be input to the monitoring circuit, and verification of the normalcy of the PUT oscillation circuit carried out from their sequential changes. However in this case, the number of input signals becomes large and the circuit complicated and hence this is not really practical.

The relationships obtained between the five currents and three voltages are given by the following six equations:

$i_A+i_G=i_K$ $i_G+i_{B2}=i_{B1}$ $i_G \approx i_{B1}$(PUT:ON), $i_G=0$(PUT:OFF)

$V_K=R_4*i_K$ $V_G=R_3*i_{B2}$ $C_1*dV_A/dt \approx -i_A$

For these six equations there are two independent variables out of the five currents and the three voltage (i.e. the total of eight variables). That is to say, if two variables of the five currents and the three voltages are known, then the remaining six variables can be ascertained from the above six equations.

Consequently, in order to verify the operation of the PUT oscillation circuit, it is sufficient to input at least two or more variables of the five currents and the three voltages to the monitoring circuit.

Figure 5:
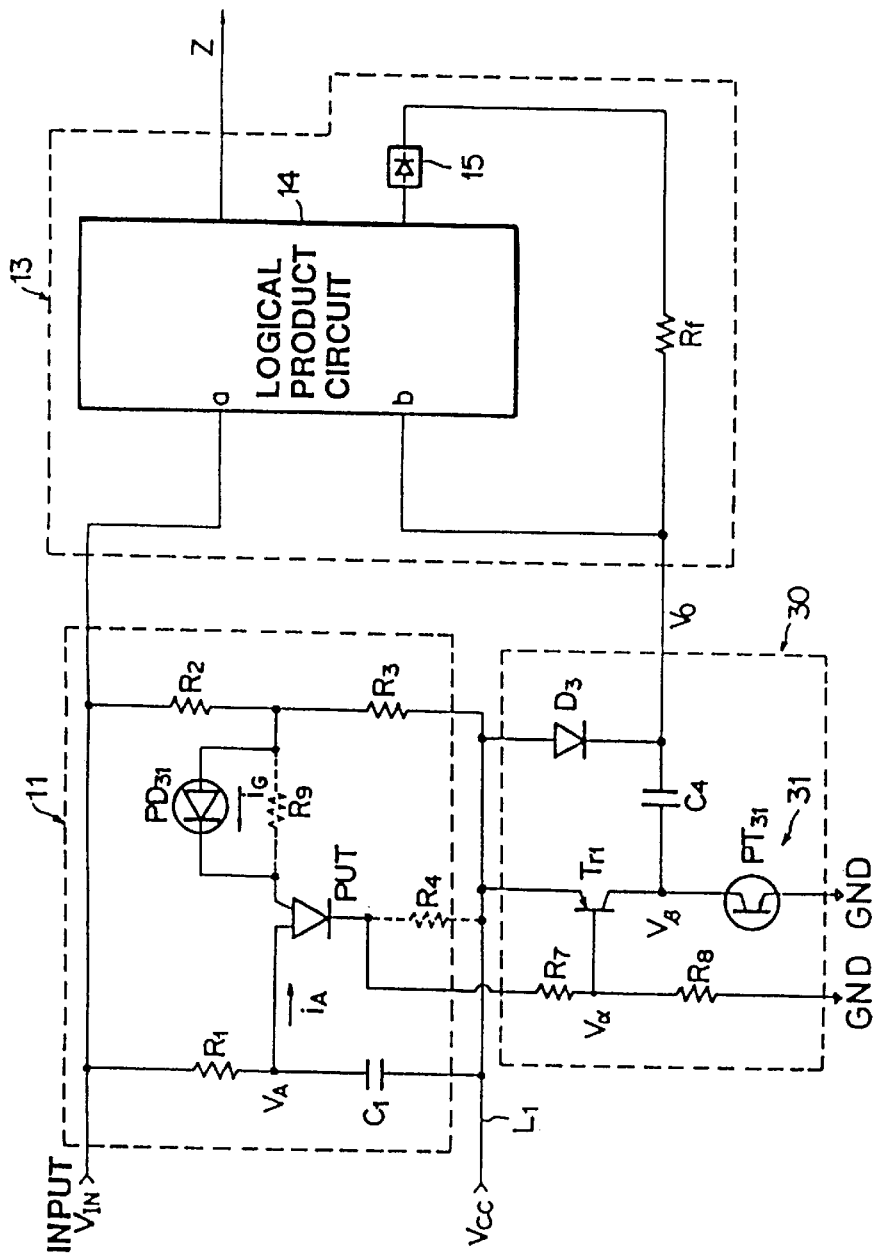
FIG. 5 is a circuit diagram of an on-delay circuit of a third embodiment according to the present invention.

FIG. 5 shows a circuit diagram of a third embodiment of an on-delay circuit. This is a circuit example for where a monitoring circuit is used which monitors using the gate current $i_G$ and the cathode voltage $V_K$. Parts the same as for the first embodiment are indicated by the same symbols and description is omitted.

In FIG. 5, a monitoring circuit 30 comprises: resistors $R_7$, $R_8$ for voltage dividing the cathode terminal voltage $V_K$ of a PUT; a transistor $Tr_1$ with an emitter terminal connected to a constant voltage line $L_1$ and a collector terminal connected to a collector terminal of a phototransistor $PT_{31}$ of a photocoupler 31 to be described later, and a voltage divided by the beforementioned resistors $R_7$, $R_8$ applied to a base terminal; a photocoupler 31 comprising a photodiode $PD_{31}$ disposed between a gate terminal of the PUT and an intermediate point between resistors $R_2$ and $R_3$, and the beforementioned phototransistor $PT_{31}$; a capacitor $C_4$ with one end connected to an intermediate point between the transistor $Tr_1$ and the phototransistor $PT_{31}$; and a diode $D_3$ with a cathode terminal connected to the other end of the capacitor $C_4$ and an anode terminal connected to the constant voltage line $L_1$. Here the resistors $R_7$, $R_8$ constitute a voltage dividing circuit, while the capacitor $C_4$ and the diode $D_3$ constitute a level conversion circuit.

Figure 6:
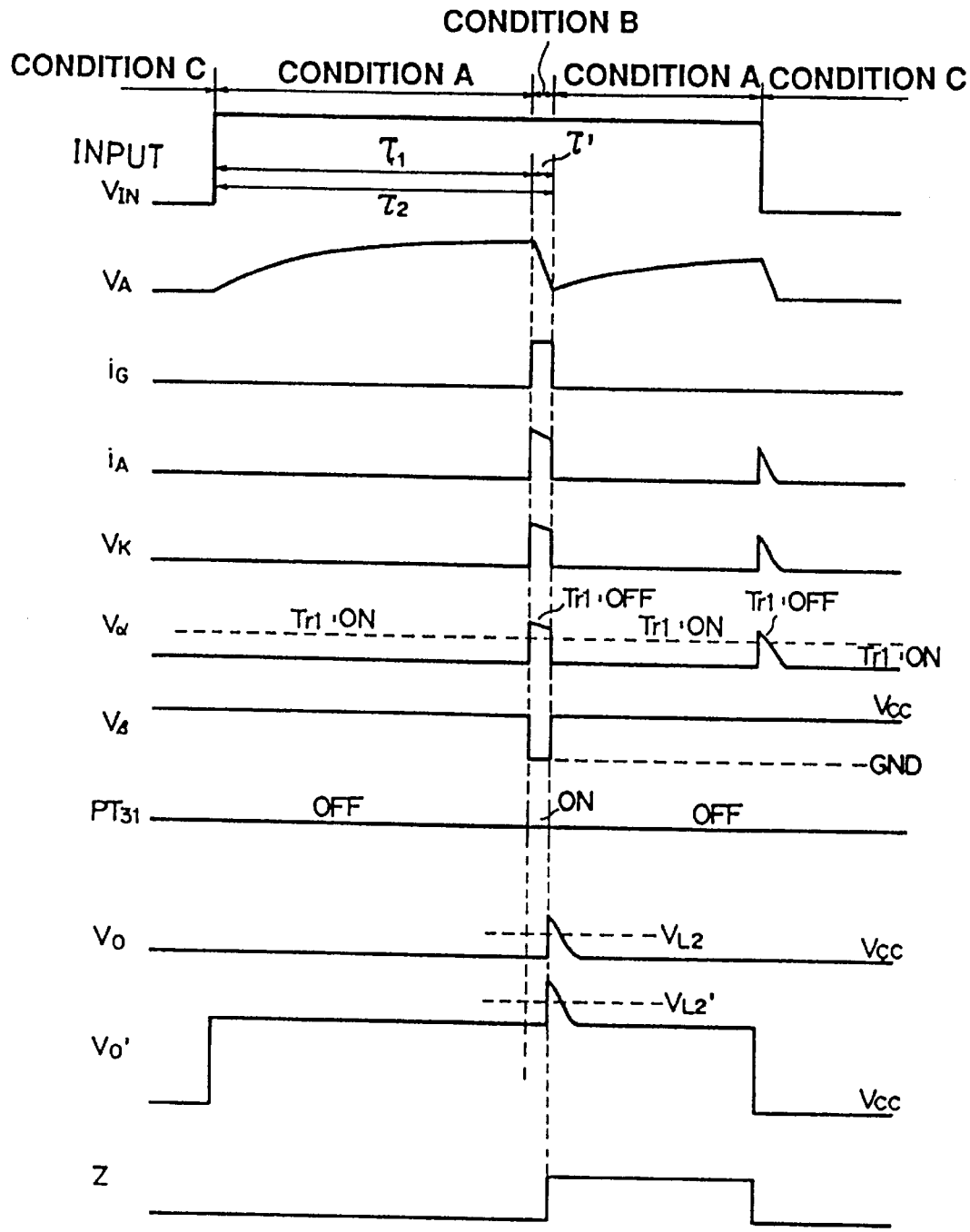
FIG. 6 is an operation time chart for the circuit of FIG. 5.

Next is a description of the operation, with reference to the operation time chart shown in FIG. 6.

The gate current $i_G$ is input to the monitoring circuit 30 using the photocoupler 31. Furthermore, the cathode terminal voltage $V_K$ is input as is to the monitoring circuit 30, and then voltage divided by the resistors $R_7$ and $R_8$ inside the monitoring circuit 30, and input to a base terminal of the transistor $Tr_1$.

When the input signal $V_{IN}$ is applied, the PUT oscillation circuit 11 becomes condition A and the PUT goes off. The gate current $i_G$ is thus zero and hence the phototransistor $PT_{31}$ is off, giving a high impedance. Moreover, since the cathode current $i_k$ of the PUT also does not flow, then a base terminal voltage Vα of the transistor $Tr_1$ falls to a level where the transistor $Tr_1$ comes on. At this time, a collector terminal voltage Vβ of the transistor $Tr_1$ is approximately at the power source potential Vcc, and the cathode terminal voltage of the diode $D_3$ is also approximately at the power source potential Vcc. Consequently the capacitor $C_4$ is in the nearly discharged condition.

With condition B of the PUT oscillation circuit 11, the PUT is on so that the charge stored in the capacitor C1 passes from the anode terminal to the cathode terminal of the PUT, and then passes through the resistor $R_7$ and the resistor $R_8$ to thus discharge. Due to the current flowing through the resistor $R_7$ and the resistor $R_8$, the base terminal voltage Va of the transistor $Tr_1$ increases to a level where the transistor $Tr_1$ goes off. Moreover, since the gate current $i_G$ flows, then the phototransistor $PT_{31}$ comes on so that the impedance drops. Consequently, the collector terminal voltage Vβ of the transistor $Tr_1$ drops to become approximately GND level. Since the cathode terminal voltage of the diode $D_3$ is approximately the power source potential Vcc, then the capacitor $C_4$ is charged to the power source potential Vcc via the diode $D_3$ and the phototransistor $PT_{31}$.

Then when the PUT oscillation circuit 11 again becomes condition A, the PUT goes off. The gate current $i_G$ thus becomes zero so that the phototransistor $PT_{31}$ goes off, giving a high impedance. Since the cathode current $i_k$ ceases to flow, then the base terminal voltage Vα of the transistor $Tr_1$ falls to a level where the transistor $Tr_1$ comes on. The collector terminal voltage Vβ of the transistor $Tr_1$ then rises to become approximately the power source potential Vcc. The change in the collector terminal voltage Vβ is level converted by the capacitor $C_4$, and a pulse voltage signal is input to the second terminal b of the logical product circuit 14 as the output Vo. The delay output signal Z thus continues to be produced from this point in time until the input signal $V_{IN}$ is cancelled.

The on-delay circuit shown in FIG. 5 does not produce an erroneous output at the time of a fault in the PUT oscillation circuit.

For example, if a short circuit fault occurs between the gate terminal and the cathode terminal of the PUT, then a current flows in the photodiode $PD_{31}$ so that the impedance of the phototransistor $PT_{31}$ drops. However, the current passed by the photodiode $PD_{31}$ flows as is through the resistor $R_7$ and the resistor $R_8$. The resistances of the resistors $R_2$, $R_3$, $R_7$ and $R_8$ can thus be set to an appropriate value so that the transistor $Tr_1$ goes off due to this current. If this is done, then at the time of the abovementioned fault, the collector terminal voltage Vβ of the transistor $Tr_1$ will be fixed at approximately GND level and thus will not change, and hence an erroneous pulse voltage will not be produced as the output Vo. Moreover, also if a short circuit fault occurs between the anode terminal and the gate terminal and the cathode terminal of the PUT, then for the same reason, an erroneous output will not be produced.

Furthermore, also if a fault occurs in the monitoring circuit 30, an erroneous output will not be produced. For example, if a disconnection fault occurs in the resistor $R_7$, the transistor $Tr_1$ will remain on. Therefore, the collector terminal voltage Vβ will be fixed at approximately the power source potential Vcc, and hence an erroneous output will not be produced. If a disconnection fault occurs in the resistor $R_8$, the transistor $Tr_1$ will remain off. Therefore, the collector terminal voltage Vβ will not be able to rise to the power source potential Vcc and hence an erroneous output will not be produced. The same also applies if a short circuit fault occurs in the base terminal, the collector terminal, or the emitter terminal of the transistor $Tr_1$. If a disconnection fault occurs in the collector terminal or the emitter terminal of the phototransistor $PT_{31}$, then the capacitor $C_4$ cannot be charged and hence an erroneous output will not be produced. Moreover, if a short circuit fault occurs in the capacitor $C_4$, the output Vo to the second terminal b of the logical product circuit 14 will become equal to or less than the power source potential Vcc, and hence an erroneous output will not be produced.

Figure 7:
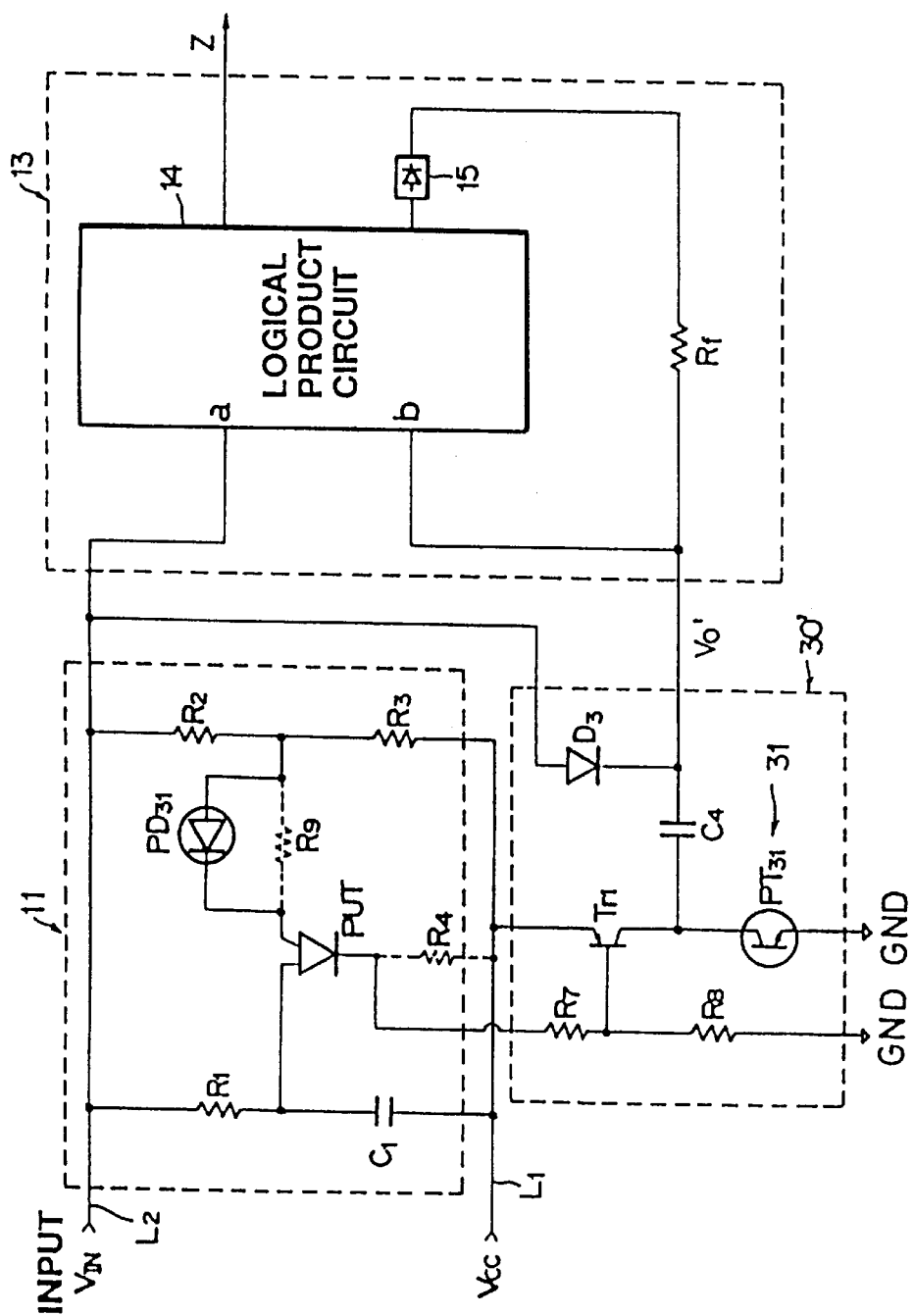
FIG. 7 is a circuit diagram of an on-delay circuit of a fourth embodiment according to the present invention.

The circuit configuration of a fourth embodiment of the present invention is shown in FIG. 7 for the case where the anode terminal of the diode $D_3$ is connected to the input signal line $L_2$.

The operation of the PUT oscillation circuit 11 and a monitoring circuit 30' is the same as for the circuit shown in FIG. 5. Aspects of the output Vo' are shown in FIG. 6. Since the pulse voltage signal is superimposed on the input signal $V_{IN}$ and then output, then this has the advantage that by monitoring the level of the output Vo', verification of the timing operation, and that the input signal $V_{IN}$ is being applied, can be carried out simultaneously. Needless to say, with the circuit configuration of FIG. 7, there is the proviso that the lower limit threshold value $V_{L2}'$ of the second terminal b of the logical product circuit 14 must be set to a higher value than the lower limit threshold value $V_{L2}$ for FIG. 5.

Now, the diode $D_3$ in the circuits shown in FIG. 5 and FIG. 7 may be replaced with a resistor. Moreover, the diode $D_3$ may be replaced by a resistor and the location of this and that of the phototransistor $PT_{31}$ interchanged. The resistors $R_4$ and $R_9$ shown by dotted lines in FIG. 5 and FIG. 7, may be respectively inserted for example for stabilising the PUT terminal potential.

The case will now be considered with the PUT oscillation circuit 11 of the on-delay circuit shown in FIG. 5 or FIG. 7, for where a short circuit fault occurs between the gate terminal and the anode terminal of the PUT, when the capacitor $C_1$ has practically no charge immediately after applying the input signal $V_{IN}$.

At this time, the charge current flowing to the capacitor $C_1$ via the resistor $R_2$ and the photodiode $PD_{31}$ is at first large and then falls to zero as the capacitor $C_1$ becomes charged. While the current is flowing in the photodiode $PD_{31}$, the phototransistor $PT_{31}$ is on, giving a low impedance. Moreover, the transistor $Tr_1$ remains on during this time. If the impedance when the transistor $Tr_1$ is on is lower than the impedance of the phototransistor $PT_{31}$ during this time, the collector terminal voltage $V\beta$ of the transistor $Tr_1$ will remain at the approximate power source potential Vcc. Therefore the capacitor $C_4$ will not be charged, and hence an erroneous output signal will not be produced. In order to achieve this, then normally a high field effect type transistor is selected for the transistor $Tr_1$.

However, in the case where the impedance relationships are opposite, then during the time that the impedance of the phototransistor $PT_{31}$ is lower than the impedance for when the transistor $Tr_1$ is on, the collector terminal voltage $V\beta$ of the transistor $Tr_1$ drops to become approximately GND level and the capacitor $C_4$ is charged. If after this, the impedance for when the transistor $Tr_1$ is on becomes lower than the impedance of the phototransistor $PT_{31}$, then the collector terminal voltage $V\beta$ of the transistor $Tr_1$ will rise to become approximately the power source potential Vcc, and hence an erroneous output will occur.

Figure 8:
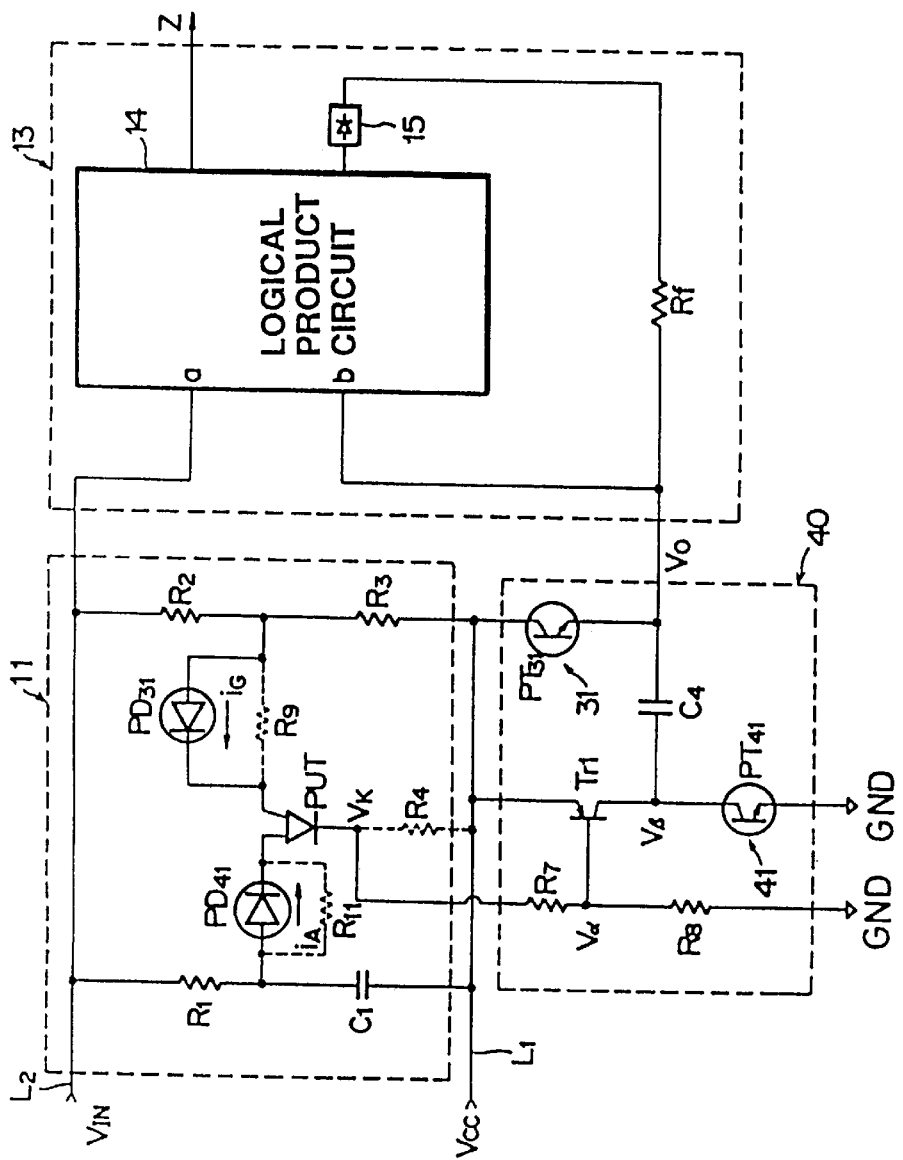
FIG. 8 is a circuit diagram of an on-delay circuit of a fifth embodiment according to the present invention.

As a means for preventing this situation, a method wherein the number of inputs to the monitoring circuit is increased (giving redundant information) can be considered. Circuit configuration examples for cases with this redundancy are given below. FIG. 8 shows a circuit example for the case where this redundancy is provided in a fifth embodiment of the on-delay circuit. This is a circuit example for where a monitoring circuit is used which monitors using the gate current $i_G$, the anode current $i_A$, and the cathode voltage $V_K$. Parts the same as for the first embodiment are indicated by the same symbols and description is omitted.

In FIG. 8, a photocoupler is added to the on-delay circuit shown in FIG. 5, for further monitoring the anode current $i_A$.

That is to say, a photodiode $PD_{41}$ of a second photocoupler 41 is provided between an intermediate point between the resistor $R_1$ and the capacitor $C_1$, and the anode terminal of the PUT, while a phototransistor $PT_{41}$ of the second photocoupler 41 is connected between the collector terminal side of the transistor $Tr_1$ and earth. Furthermore, a phototransistor $PT_{31}$ of the first photocoupler 31 is inserted instead of the diode $D_3$, between the capacitor $C_4$ and the constant voltage line $L_1$.

With such a construction, if as mentioned above a short circuit fault occurs between the gate terminal and the anode terminal of the PUT, then the charging current flowing to the capacitor $C_1$ via the resistor $R_2$ and the photodiode $PD_{31}$ is stopped by the photodiode $PD_{41}$ of the second photocoupler 41 and hence does not flow. If this did flow, with the photodiode $PD_{41}$ at that time becoming short circuited, then the phototransistor $PT_{41}$ would not become a low impedance. Therefore the collector terminal voltage $V\beta$ of the transistor $Tr_1$ would remain approximately at the power source potential Vcc without change, and hence the capacitor $C_4$ would not be charged. Hence an erroneous output would not be produced.

Figure 9:
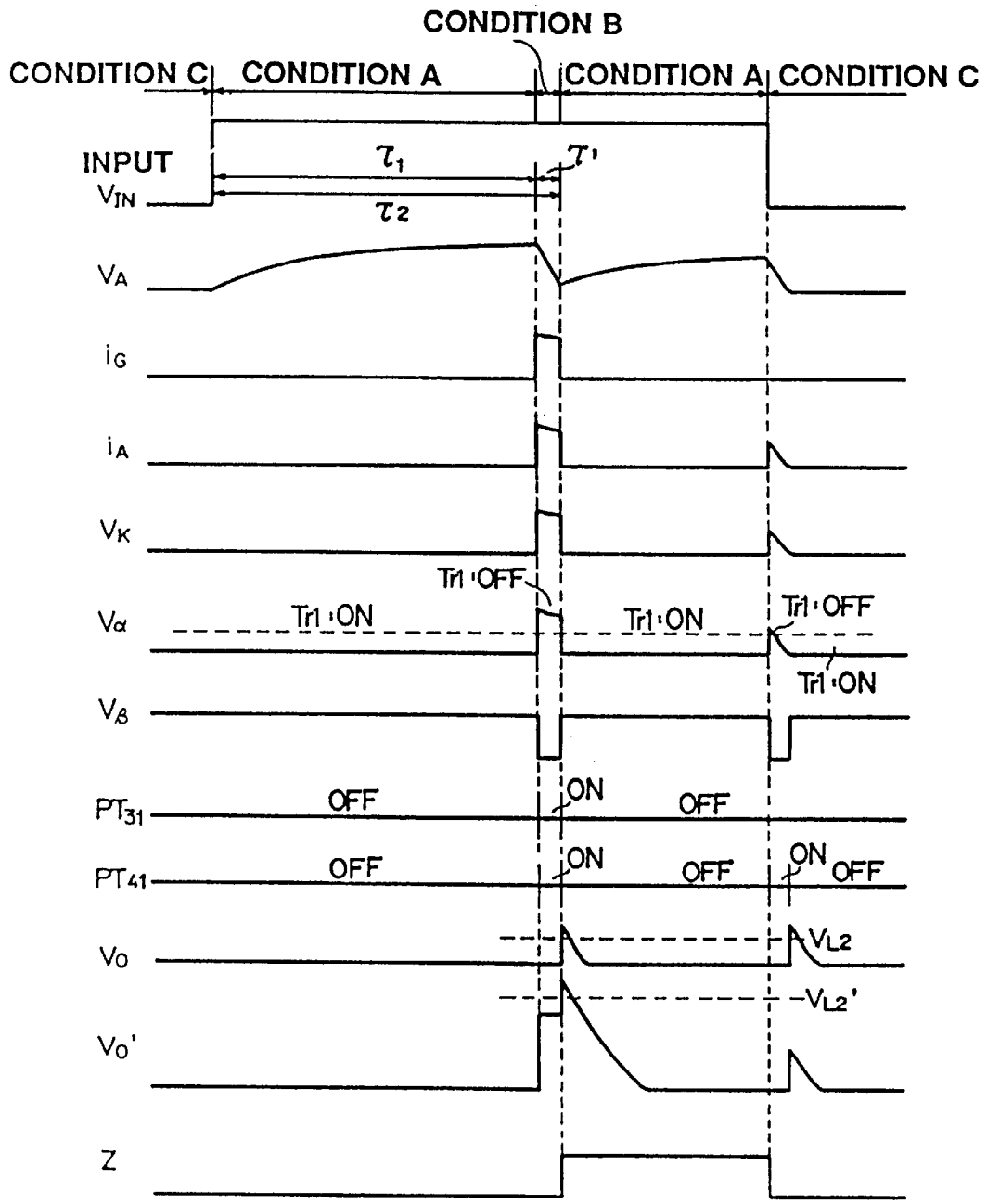
FIG. 9 is an operation time chart for the circuit of FIG. 8.

Basically the operation is the same as for the on-delay circuit of FIG. 5, and hence description of the operation is omitted. Needless to say, the circuit of FIG. 8 satisfies the safety conditions of the on-delay circuit of FIG. 5. An operation time chart for the circuit of FIG. 8 is shown in FIG. 9.

Figure 10:
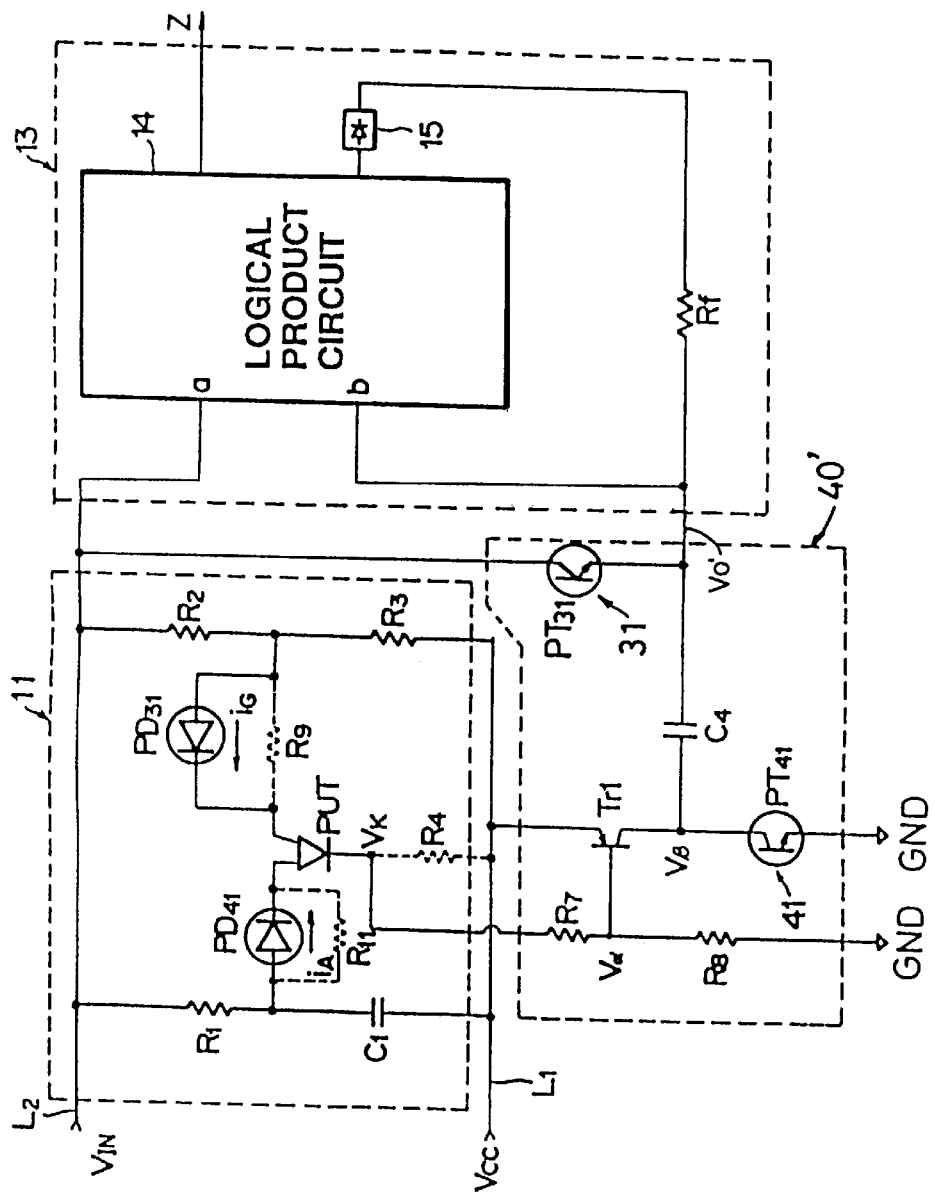
FIG. 10 is a circuit diagram of an on-delay circuit of a sixth embodiment according to the present invention.

As a sixth embodiment, then as shown in FIG. 10, it is also possible to have the collector terminal of the phototransistor $PT_{31}$ connected to the input signal line $L_2$. Aspects of the output Vo' for this case are shown as Vo' in the operation chart of FIG. 9.

With such a construction, verification of the timing operation, and that the input signal $V_{IN}$ is being applied, can be carried out simultaneously, with the advantage that the fail-safe characteristics are improved. Needless to say, with the circuit configuration of FIG. 10, there is the proviso that the lower limit threshold value $V_{L2}'$ of the second terminal b of the logical product circuit 14 must be set to a higher value than the lower limit threshold value $V_{L2}$ for FIG. 8.

Now, the locations of the phototransistor $PT_{31}$ and the phototransistor $PT_{41}$ in the circuits shown in FIG. 8[and FIG. 10 may be interchanged. Moreover, the resistors $R_4$, $R_9$, and $R_{11}$ shown by dotted lines in FIG. 8 and FIG. 10, may be respectively inserted for example for stabilising the PUT terminal potential.

Figure 11:
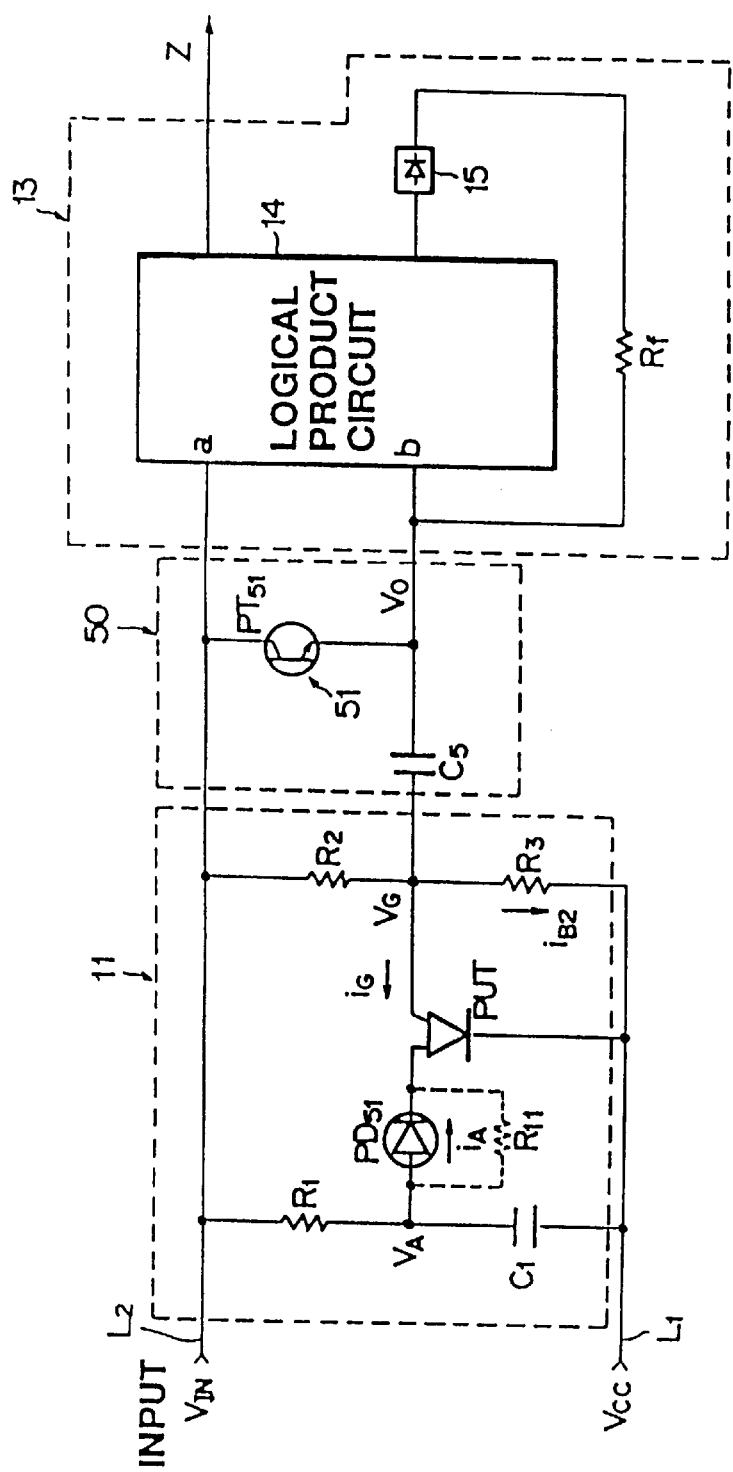
FIG. 11 is a circuit diagram of an on-delay circuit of a seventh embodiment according to the present invention.

FIG. 11 shows a circuit diagram of a seventh embodiment of an on-delay circuit. This is a circuit example for where a monitoring circuit is used which monitors using the anode current $i_A$ and the gate voltage $V_G$.

In FIG. 11, a monitoring circuit 50 comprises: a capacitor $C_5$ with one end connected to an intermediate point between a resistor $R_2$ and a resistor $R_3$; and a photocoupler 51 comprising a photodiode $PD_{51}$ provided between an intermediate point between a resistor $R_1$ and a capacitor $C_1$, and an anode terminal of a PUT, and a phototransistor $PT_{51}$ with an emitter terminal connected to the other end of the capacitor $C_5$ and a collector terminal connected to an input signal line $L_2$.

Figure 12:
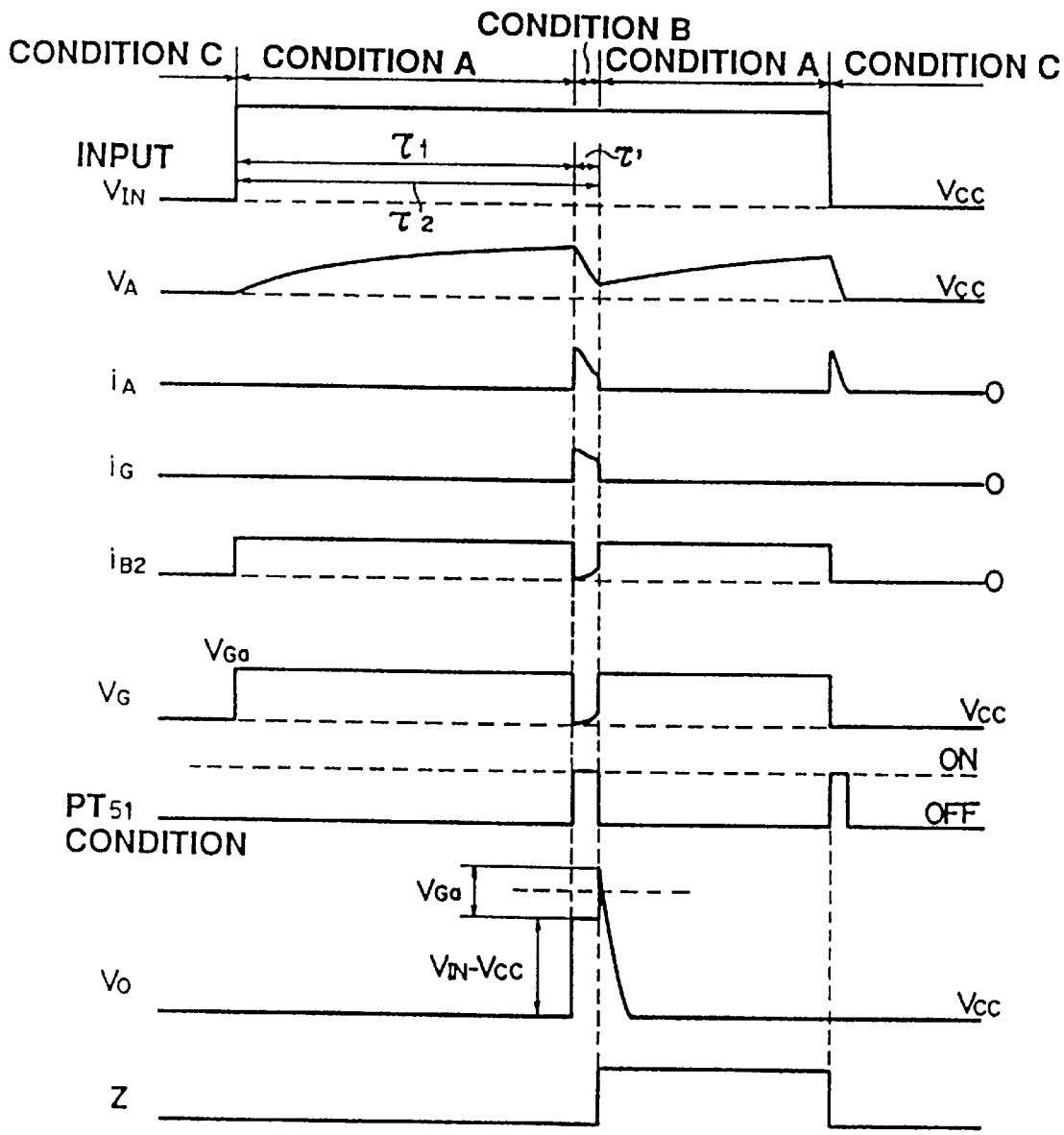
FIG. 12 is an operation time chart for the circuit of FIG. 11.

The operation of the above circuit will now be described with reference to the operation time chart shown in FIG. 12.

When an input signal $V_{IN}$ is applied, a PUT oscillation circuit 11 becomes condition A. At this time the PUT is off and the anode current $i_A$ is zero. Furthermore, the gate current $i_G$ is also zero, and the gate voltage $V_G$ becomes a value for the input signal $V_{IN}$, voltage divided by the resistor $R_2$ and the resistor $R_3$ (hereunder this voltage is referred to as $V_{Ga}$).

When the PUT oscillation circuit 11 changes from condition A to condition B, the PUT comes on and the anode current $i_A$ and the gate current $i_G$ flow. Due to the anode current $i_A$ flowing through the photodiode $PD_{51}$, the phototransistor $PT_{51}$ becomes a low impedance so that the emitter terminal voltage of the phototransistor $PT_{51}$ rises to become approximately the input signal $V_{IN}$. Moreover, since the majority of the current flowing through the resistor $R_2$ flows as the gate current $i_G$, then the gate voltage $V_G$ drops to become approximately the power source potential Vcc.

Consequently, the capacitor $C_5$ is charged to a voltage of approximately $V_{IN}-Vcc$.

Next, when the PUT oscillation circuit 11 changes from condition B to condition A, the PUT goes off so that the anode current $i_A$ becomes zero, and the phototransistor $PT_{51}$ becomes a high impedance. The gate voltage $V_G$ thus rises from the power source potential Vcc to again become $V_{Ga}$. The change in voltage of the gate voltage $V_G$ is level converted by the capacitor $C_5$, so that a high wave pulse voltage ($V_{IN}+V_{Ga}-Vcc$) is produced as the output Vo. This pulse voltage is input as a trigger signal to a second terminal b of a logical product circuit 14, and the logical product circuit 14 then produces a delay output signal Z. After this, the delay output signal Z continues to be produced while the input signal $V_{IN}$ is being applied, and if the input signal $V_{IN}$ is cancelled, the delay output signal Z also stops.

With this circuit configuration also, an erroneous output will not be produced due to a fault in the PUT oscillation circuit 11 or a fault in the monitoring circuit 50. For example, if a short circuit fault occurs between the gate terminal and the cathode terminal of the PUT, the gate voltage $V_G$ becomes fixed at the power source potential Vcc so that the rising change in $V_{Ga}$ necessary for the pulse voltage output cannot be effected. Hence an erroneous output will not be produced. Moreover, also if a short circuit fault occurs between the anode terminal and the gate terminal and the cathode terminal of the PUT, since the gate voltage $V_G$ is fixed at the power source potential Vcc, then similarly an erroneous output will not be produced. Furthermore, if a short circuit fault occurs in the phototransistor $PT_{51}$ of the monitoring circuit 50, the output Vo will be fixed at the input signal $V_{IN}$. Therefore a pulse voltage superimposed on the input signal $V_{IN}$ will not be output as the output Vo.

The resistor $R_{11}$ shown by the dotted line in FIG. 11, may be inserted for example for stabilizing the PUT terminal potential.

Figure 13:
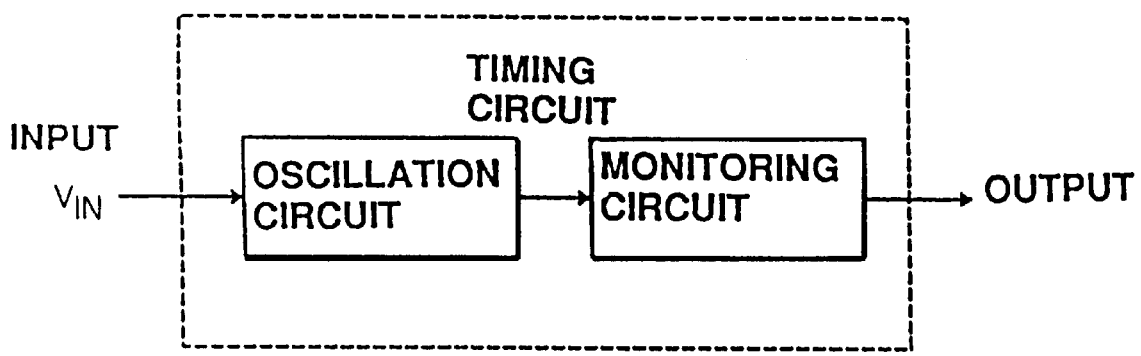
FIG. 13 is a diagram showing signal input conditions for a monitoring circuit of a timing circuit according to the present invention; (A) being an example for where only a signal from an oscillation circuit is input, and (B) being an example for where the signal from the oscillation circuit as well as an input signal are input.
Figure 13:
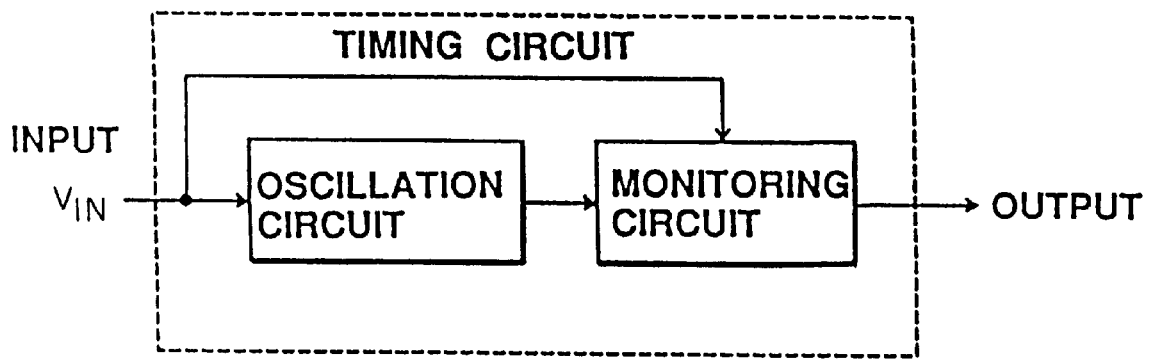

From the beforementioned respective embodiments, then with the timing circuit comprising the oscillation circuit and the monitoring circuit, the cases as shown in FIG. 13 can be considered where, for the signal input condition to the monitoring circuit, then as shown in FIG. 13 (A), only the signal information from the oscillation circuit is received (corresponding to the embodiments of FIG. 1, FIG. 5 and FIG. 8), and, as shown in FIG. 13 (B), in addition to the signal information from the oscillation circuit, the input signal for input to the oscillation circuit is also directly received (corresponding to the embodiments of FIG. 4, FIG. 7, FIG. 10 and FIG. 11).

In the case of the construction of FIG. 13 (B), the application of the input signal $V_{IN}$ to the timing circuit can be verified by a dual system, from the output from the oscillation circuit, and from the input signal input directly to the monitoring circuit. Hence the fail-safe characteristic can be further increased, and the reliability of the timing circuit improved.

It can be considered that in the case where, in the circuit of FIG. 4, a short circuit fault occurs in the diode $D_2$, or in the circuit of FIG. 7, a short circuit fault occurs in the diode $D_3$, or in the circuit of FIG. 11, a short circuit fault occurs in the phototransistor $PT_{51}$, then the feedback input to the second terminal b of the logical product circuit 14 will also be applied to the first terminal a. Therefore, the operation of the logical product circuit 14 will lose its dependency on the input signal $V_{IN}$. In order to avoid this situation, the signal input line to the PUT oscillation circuit 11 and the signal input line to the first terminal a can be in separate systems, so that as a result for example of a short circuit fault, the feedback input will not be input to the first terminal a.

Figure 14:
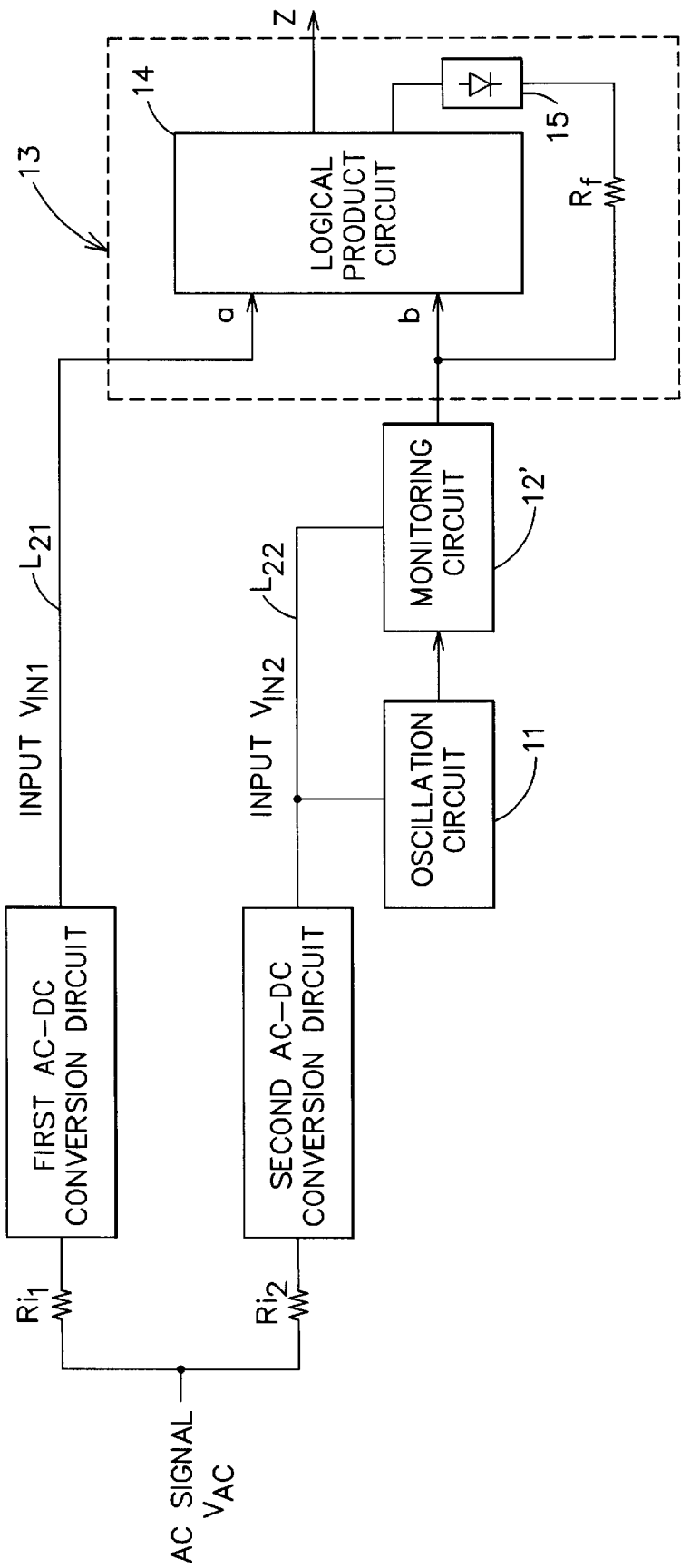
FIG. 14 is a circuit diagram of an on-delay circuit of an eighth embodiment according to the present invention.

As a method of having the signal input line to the logical product circuit 14 and the signal input line to the PUT oscillation circuit in separate systems, then for example in the case where the input signal $V_{IN}$ is an output from an AC-DC conversion circuit (for example a rectifying circuit or the like, and possibly including an amplifying circuit and a transformer coupling circuit or the like), a circuit configuration of an eighth embodiment of the present invention as shown in FIG. 14 can be considered.

In FIG. 14, an input signal to a first terminal a of a logical product circuit 14 is made $V_{IN1}$, while an input signal to a PUT oscillation circuit 11 and for example a monitoring circuit 12' is made $V_{IN2}$. The two input signals $V_{IN1}$, $V_{IN2}$ are signals for where a common AC signal $V_{AC}$ has been converted to DC. With the input signal $V_{IN1}$, the AC signal $V_{AC}$ is converted to DC by a first AC-DC conversion circuit 61 via a resistor $R_{i1}$, and then applied to the first terminal a of the logical product circuit 14 by means of a first input signal line $L_{21}$. With the input signal $V_{IN2}$, the AC signal $V_{AC}$ is converted to DC by a second AC-DC conversion circuit 62 via a resistor $R_{i2}$, and then applied to the PUT oscillation circuit 11 and the monitoring circuit 12' by means of a second input signal line $L_{22}$.

With this circuit configuration, the worst fault where the feedback signal to the second terminal b of the logical product circuit 14 is input to the first terminal a of the logical product circuit 14, is for where a short circuit fault occurs between the respective input and output terminals of the first AC-DC conversion circuit 61 and the second AC-DC conversion circuit 62. In practice, the occurrence of such a fault unlikely. However with such a fault, the feedback signal to the second terminal b is input to the first terminal a via at least the resistor $R_{i1}$ and the resistor $R_{i2}$.

Consequently the resistances can be determined so that by resistive dividing the resistances of the added resistance value of the resistor $R_{i1}$ and the resistor $R_{i2}$ ($R_{i1}+R_{i2}$) and the input impedance of the first terminal a of the logical product circuit 14, the level of the feedback signal for input to the first terminal a becomes less than the lower limit threshold value held by the first terminal a. If this is done, then the logical product circuit 14 will not oscillate erroneously with only the feedback signal being input to the first terminal a as a result of the feedback signal to the second terminal b of the logical product circuit 14 being transmitted to the input signal line $L_{22}$ due to a fault in the monitoring circuit 12'. Hence the situation where the operation of the logical product circuit 14 loses its dependency on the input signal $V_{IN1}$ (in fact the AC signal Vac) can be prevented.

With the circuit configuration of FIG. 14, the resistors $R_{i1}$ and $R_{i2}$ are inserted on the respective input sides of the first and second AC-DC conversion circuits 61, 62. However it is sufficient to have just one resistor corresponding to the beforementioned resistance value $R_{i1}+R_{i2}$, in only one input side.

With the respective embodiments of the present invention, the examples have been given for a PUT oscillation circuit which uses a PUT in the oscillation circuit. However it will be clear that instead of a PUT, an oscillation circuit which uses a UJT (uni junction transistor) or a double base diode can be used. For the oscillation circuit, a circuit which carries out a relaxation oscillation operation can be used. For example a one shot multi-vibrator can be used. Moreover, in the detection of the current in the timing circuit, the description involves using a photocoupler. However as well as such a contactless relay, a relay having contact points, such as an electromagnetic relay can be used. Furthermore, with the configuration examples of the monitoring circuits, the descriptions were for where the transistor was a bipolar transistor. However other types of switching element (for example a MOSFET) can be used.

With the present invention as described above, the construction involves providing a monitoring circuit for monitoring for the normalcy of the oscillation circuit, to thus verify if the oscillation circuit is normal. Therefore even if there is a fault in the oscillation circuit or the monitoring circuit, the generation of an erroneous timing output can be prevented, and the timing circuit thus made fail-safe.

Furthermore, by inputting both the output signal from the oscillation circuit and the input signal, to the monitoring circuit, then the fact that the input signal has been applied to the timing circuit can be verified by a dual system[?], and hence the fail-safe characteristics can be further improved.

Moreover, if the oscillation circuit and the monitoring circuit malfunction, it is possible to prevent the generation of an erroneous delay output signal. Hence the fail-safe characteristics of the on-delay circuit can be increased. Furthermore, it is possible to prevent the feedback signal to the second terminal of the self hold circuit from being applied to the first terminal due to a fault in the circuit elements. Hence the fail-safe characteristics of the on-delay circuit can be further improved.

INDUSTRIAL APPLICABILITY

The present invention enables improvement in the fail-safe characteristics of control mechanisms and the like which use timing circuits or on-delay circuits. Hence industrial applicability is considerable.

We claim:

1. A fail-safe timing circuit characterized in comprising: an oscillation circuit which produces an oscillating output using the switching of a switching element, after the lapse of a previously set predetermined time from after applying an input signal; and a monitoring circuit for monitoring for the normalcy of said oscillation circuit based on electrical operating conditions of said oscillation circuit, and generating an output signal only when said oscillation circuit is normal;

wherein with said monitoring circuit, a signal from said oscillation circuit, and said input signal are input thereto.

2. A fail-safe timing circuit according to claim 1, wherein said monitoring circuit monitors for the normalcy of said oscillation circuit based on a signal change which is produced only when said oscillation circuit is operating normally.

3. A fail-safe timing circuit characterized in comprising: an oscillation circuit which produces an oscillating ouput using the switching of a switching element, after the lapse of a previously set predetermined time from after applying an input signal; and a monitoring circuit for monitoring for the normalcy of said oscillation circuit based on electrical operating conditions of said oscillation circuit, and generating an output signal only when said oscillation circuit is normal;

wherein said monitoring circuit monitors for the normalcy of said oscillation circuit based on a sequential signal change in the various parts of said oscillation circuit for when said oscillation circuit is operating normally.

4. A fail-safe timing circuit characterized in comprising: an oscillation circuit which produces an oscillating ouput using the switching of a switching element, after the lapse of a previously set predetermined time from after applying an input signal; and a monitoring circuit for monitoring for the normalcy of said oscillation circuit based on electrical operating conditions of said oscillation circuit, and generating an output signal only when said oscillation circuit is normal;

wherein said monitoring circuit monitors for the normalcy of said oscillation circuit based on a signal change which is produced only when said oscillation circuit is operating normally, and when said oscillation circuit is a PUT oscillation circuit which uses a PUT (programmable uni junction transistor) for the switching element, there is provided:

a differentiating circuit for differentiating a cathode terminal voltage of said PUT;

a photocoupler comprising a photodiode with an anode side connected to a constant voltage line and a cathode side connected to an output terminal of said differentiating circuit, and a phototransistor with a collector side connected to the constant voltage line via a resistor, and an emitter side connected to earth; and a level conversion circuit comprising a capacitor and a diode with said capacitor connected between an intermediate point between said resistor and said phototransistor and a cathode side of said diode, and an anode side of said diode connected to said constant voltage line, and an output signal from said level conversion circuit is made the output signal from said monitoring circuit.

5. A fail-safe timing circuit according to claim 1, wherein said monitoring circuit monitors for the normalcy of said oscillation circuit based on a signal change which is produced only when said oscillation circuit is operating normally, and when said oscillation circuit is a PUT oscillation circuit which uses a PUT for the switching element, there is provided:

a differentiating circuit for differentiating a cathode terminal voltage of said PUT;

a photocoupler comprising a photodiode with an anode side connected to a constant voltage line and a cathode side connected to an output terminal of said differentiating circuit, and a phototransistor with a collector side connected via a resistor to an input signal line to which said input signal is applied, and an emitter side connected to said constant voltage line; and a level conversion circuit comprising a capacitor and a diode with said capacitor connected between an intermediate point between said resistor and said phototransistor and a cathode side of said diode, and an anode side of said diode connected to said input signal line, and an output signal from said level conversion circuit is made the output signal from said monitoring circuit.

6. A fail-safe timing circuit characterized in comprising: an oscillation circuit which produces an oscillating ouput using the switching of a switching element, after the lapse of a previously set predetermined time from after applying an input signal; and a monitoring circuit for monitoring for the normalcy of said oscillation circuit based on electrical operating conditions of said oscillation circuit, and generating an output signal only when said oscillation circuit is normal;

wherein said monitoring circuit monitors for the normalcy of said oscillation circuit based on a sequential signal change in the various parts of said oscillation circuit for when said oscillation circuit is operating normally, and when said oscillation circuit is a PUT oscillation circuit which uses a PUT for the switching element, there is provided:

a photocoupler comprising a photodiode and a phototransistor, for detecting the presence of a gate current of the PUT of said oscillation circuit;

a voltage dividing circuit for dividing a cathode voltage of said PUT;

a transistor with an emitter side connected to a constant voltage line and a collector side connected to a collector side of said phototransistor, and a voltage divided by said voltage dividing circuit input to a base terminal; and a level conversion circuit comprising a capacitor and a diode with said capacitor connected between an intermediate point between said transistor and said phototransistor and a cathode side of said diode, and an anode side of said diode connected to said constant voltage line, and an output signal from said level conversion circuit is made the output signal from said monitoring circuit.

7. A fail-safe timing circuit characterized in comprising:

an oscillation circuit which produces an oscillating ouput using the switching of a switching element, after the lapse of a previously set predetermined time from after applying an input signal; and a monitoring circuit for monitoring for the normalcy of said oscillation circuit based on electrical operating conditions of said oscillation circuit, and generating an output signal only when said oscillation circuit is normal;

wherein said monitoring circuit monitors for the normalcy of said oscillation circuit based on a sequential signal change in the various parts of said oscillation circuit for when said oscillation circuit is operating normally, and when said oscillation circuit is a PUT oscillation circuit which uses a PUT for the switching element, there is provided:

a first photocoupler comprising a first photodiode and a first phototransistor, for detecting the presence of a gate current of the PUT of said oscillation circuit;

a second photocoupler comprising a second photodiode and a second phototransistor, for detecting the presence of an anode current of the PUT of said oscillation circuit;

a voltage dividing circuit for dividing a cathode voltage of said PUT;

a transistor with an emitter side connected to a constant voltage line and a collector side connected to a collector side of said second phototransistor, and a voltage divided by said voltage dividing circuit input to a base terminal; and a level conversion circuit comprising a capacitor and said first phototransistor with said capacitor connected between an intermediate point between said transistor and said second phototransistor and an emitter side of said first phototransistor, and a collector side of said first phototransistor connected to said constant voltage line, and an output signal from said level conversion circuit is made the output signal from said monitoring circuit.

8. A fail-safe timing circuit according to claim 1, wherein said monitoring circuit monitors for the normalcy of said oscillation circuit based on a sequential signal change in the various parts of said oscillation circuit for when said oscillation circuit is operating normally, and when said oscillation circuit is a PUT oscillation circuit which uses a PUT for the switching element, there is provided:

a photocoupler comprising a photodiode and a phototransistor, for detecting the presence of a gate current of the PUT of said oscillation circuit;

a voltage dividing circuit for dividing a cathode voltage of said PUT;

a transistor with an emitter side connected to a constant voltage line and a collector side connected to a collector side of said phototransistor, and a voltage divided by said voltage dividing circuit input to a base terminal; and a level conversion circuit comprising a capacitor and a diode with said capacitor connected between an intermediate point between said transistor and said phototransistor and a cathode side of said diode, and an anode side of said diode connected to an input signal line, and an output signal from said level conversion circuit is made the output signal from said monitoring circuit.

9. A fail-safe timing circuit according to claim 1, wherein said monitoring circuit monitors for the normalcy of said oscillation circuit based on a sequential signal change in the various parts of said oscillation circuit for when said oscillation circuit is operating normally, and when said oscillation circuit is a PUT oscillation circuit which uses a PUT for the switching element, there is provided:

a first photocoupler comprising a first photodiode and a first phototransistor, for detecting the presence of a gate current of the PUT of said oscillation circuit;

a second photocoupler comprising a second photodiode and a second phototransistor, for detecting the presence of an anode current of the PUT of said oscillation circuit;

a voltage dividing circuit for dividing a cathode voltage of said PUT;

a transistor with an emitter side connected to a constant voltage line and a collector side connected to a collector side of said second phototransistor, and a voltage divided by said voltage dividing circuit input to a base terminal; and a level conversion circuit comprising a capacitor and said first phototransistor with said capacitor connected between an intermediate point between said transistor and said second phototransistor and an emitter side of said first phototransistor, and a collector side of said first phototransistor connected to an input signal line, and an output signal from said level conversion circuit is made the output signal from said monitoring circuit.

10. A fail-safe timing circuit according to claim 1, wherein said monitoring circuit monitors for the normalcy of said oscillation circuit based on a sequential signal change in the various parts of said oscillation circuit for when said oscillation circuit is operating normally, and when said oscillation circuit is a PUT oscillation circuit which uses a PUT for the switching element, there is provided:

a photocoupler comprising a photodiode and a phototransistor, for detecting the presence of an anode current of thePUT of said oscillation circuit; and a level conversion circuit comprising a capacitor and the phototransistor of said photocoupler, with one end of said capacitor connected to an emitter side of said phototransistor which has a collector side connected to an input signal line, and a gate voltage applied to the other end of said capacitor, and an output signal from said level conversion circuit is made the output signal from said monitoring circuit.

11. A fail-safe timing circuit according to claim 1, wherein said oscillation circuit is a one shot multi-vibrator.

12. A fail-safe timing circuit characterized in comprising:

an oscillation circuit which produces an oscillating ouput using the switching of a switching element, after the lapse of a previously set predetermined time from after applying an input signal; and a monitoring circuit for monitoring for the normalcy of said oscillation circuit based on electrical operating conditions of said oscillation circuit, and generating an output signal only when said oscillation circuit is normal;

together with a self hold circuit with the input signal for input to said timing circuit input to a first terminal, and the output signal from said monitoring circuit input to a second terminal, which produces an output signal when the input signals input to said first and second terminals are both higher than a power source potential, and which feeds back said output signal to the second terminal to self hold said output signal, and the output signal from said self hold circuit is made a delay output signal.

13. An on-delay circuit according to claim 12, wherein an input signal line of said timing circuit and an input signal line to the first terminal of said self hold circuit are in separate systems, and a resistance is disposed in at least one of the input signal lines.

* * * * *